United States Patent
Suh et al.

(10) Patent No.: US 6,916,147 B2
(45) Date of Patent: Jul. 12, 2005

(54) SUBSTRATE STORAGE CASSETTE WITH SUBSTRATE ALIGNMENT FEATURE

(75) Inventors: Dongchoon Suh, Santa Clara, CA (US); Wendell T. Blonigan, Union City, CA (US); Rolf A. Guenther, Monte Sereno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 10/280,451

(22) Filed: Oct. 25, 2002

(65) Prior Publication Data
US 2004/0081547 A1 Apr. 29, 2004

(51) Int. Cl.⁷ .......................... B65B 21/02; B65B 69/00; B65G 65/04; B65G 65/34
(52) U.S. Cl. .................. 414/416.08; 414/810; 414/936
(58) Field of Search ........................... 414/217, 416.08, 414/744.6, 810, 936, 937, 757, 770, 416

(56) References Cited

U.S. PATENT DOCUMENTS

| | | | |
|---|---|---|---|
| 5,205,028 A | * 4/1993 | Leonard | 29/271 |
| 5,472,099 A | * 12/1995 | Terashima | 211/41.18 |
| 5,533,243 A | * 7/1996 | Asano | 29/25.01 |
| 5,556,248 A | * 9/1996 | Grunes | 414/416.03 |
| 5,705,814 A | 1/1998 | Young et al. | 250/306 |
| 5,782,362 A | * 7/1998 | Ohori | 206/711 |
| 5,853,214 A | * 12/1998 | Babbs et al. | 294/161 |
| 5,960,959 A | 10/1999 | Wu et al. | 206/710 |
| 6,052,913 A | * 4/2000 | Kaneko et al. | 33/645 |
| 6,092,981 A | 7/2000 | Pfeiffer et al. | 414/810 |
| 6,145,673 A | 11/2000 | Burrows et al. | |
| 6,178,361 B1 | 1/2001 | George et al. | 700/213 |
| 6,382,901 B1 | * 5/2002 | Hong et al. | 414/757 |
| 2002/0014390 A1 | 2/2002 | Shinozuka | 198/510.1 |

* cited by examiner

Primary Examiner—Eileen D. Lillis
Assistant Examiner—Charles A. Fox
(74) Attorney, Agent, or Firm—Moser, Patterson & Sheridan LLP

(57) ABSTRACT

A substrate storage cassette and a method of orienting a substrate disposed therein are provided. In one embodiment, the substrate storage cassette includes a plurality of flanges pairs disposed between a first lateral sidewall coupled in a spaced-apart relation to a second lateral sidewall. Each of the flange pairs adapted to support a substrate thereon. At least a first alignment feature disposed between the flange pair and adapted to mate with an orientation feature of the substrate when the substrate is in a predefined orientation.

37 Claims, 20 Drawing Sheets

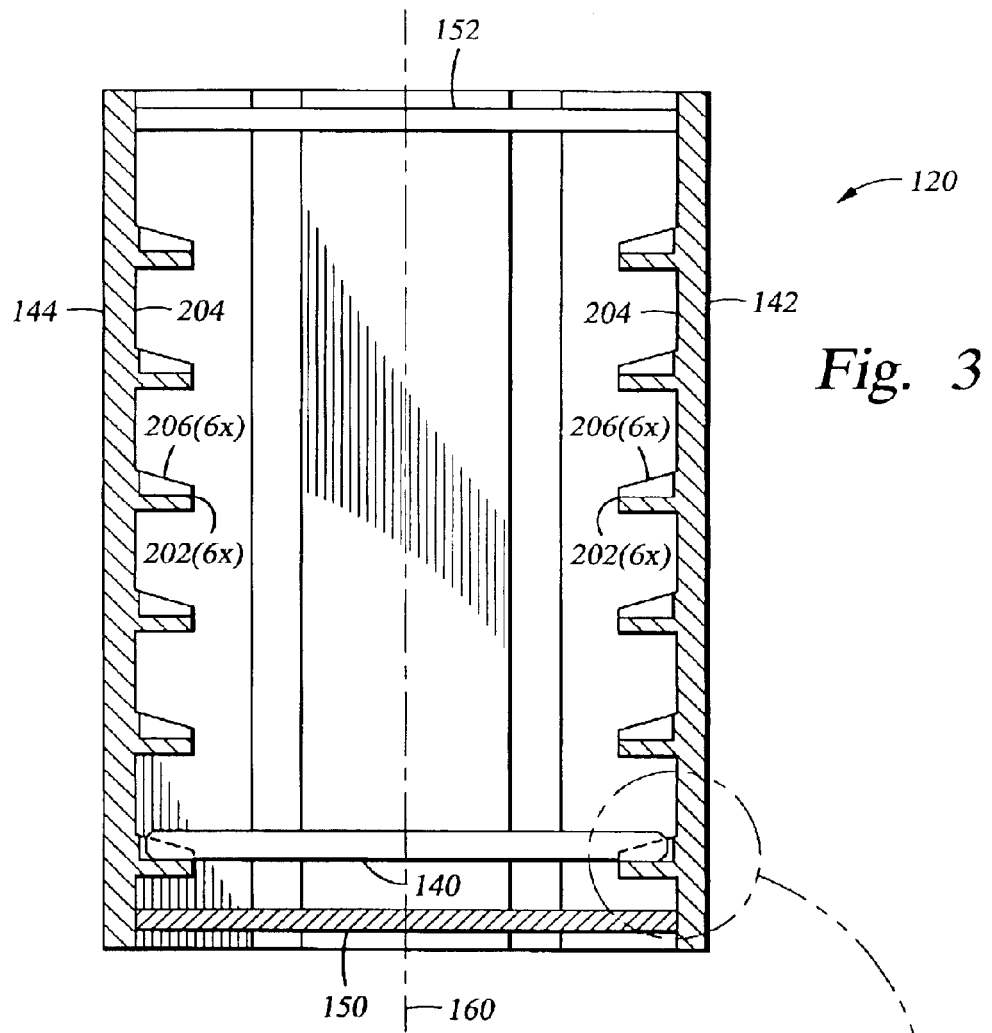
*Fig. 3*
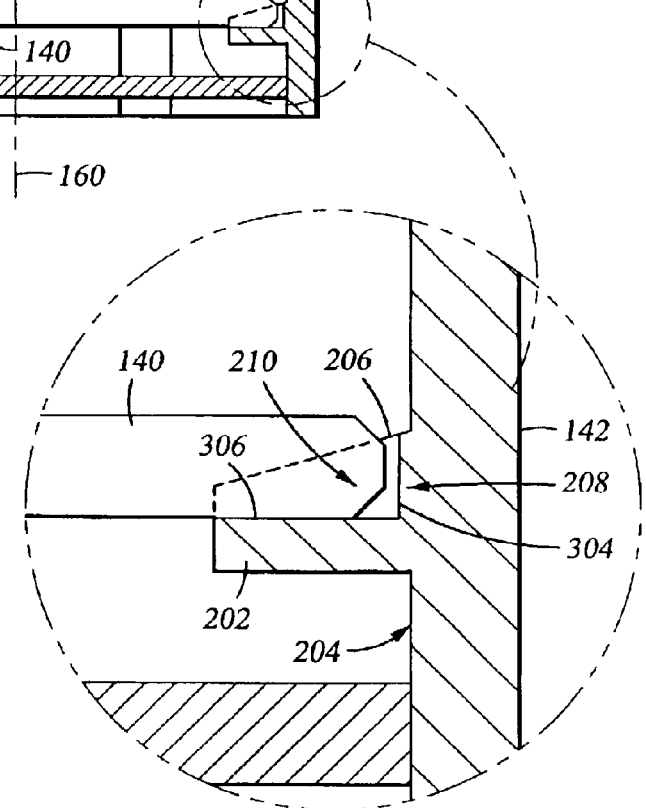

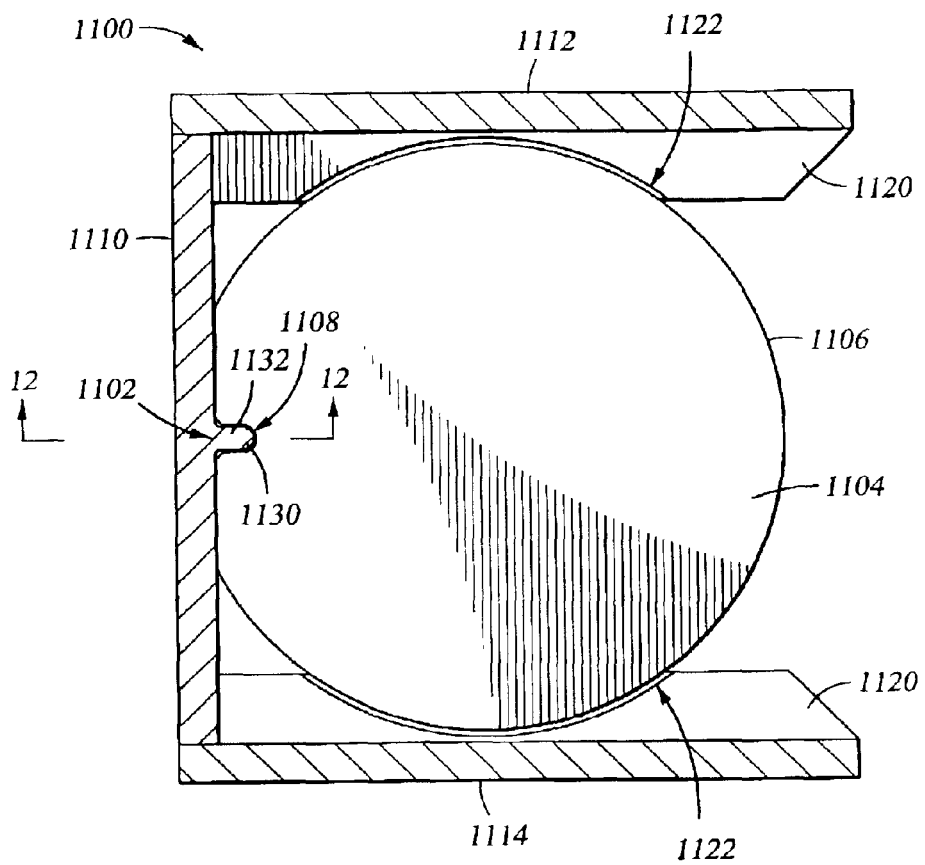
Fig. 11
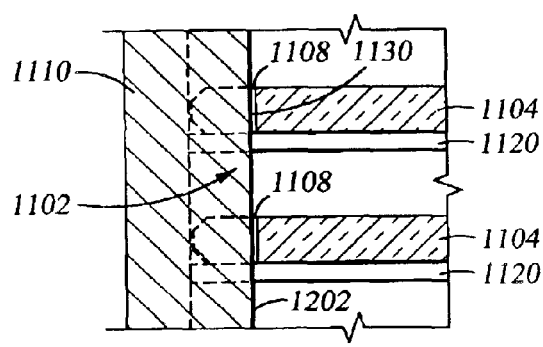 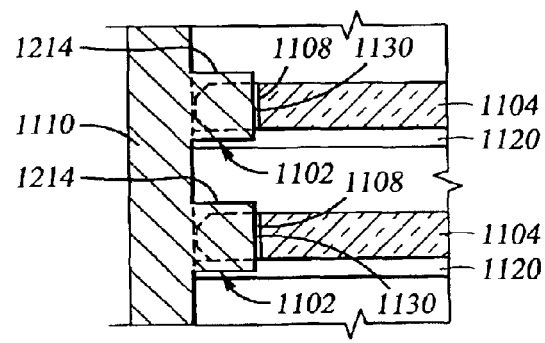
Fig. 12A  Fig. 12B

SUBSTRATE STORAGE CASSETTE WITH SUBSTRATE ALIGNMENT FEATURE

BACKGROUND OF THE INVENTION

1. Field of the Invention

Embodiments of the present invention generally relate to a substrate storage cassette.

2. Description of the Related Art

Semiconductor substrate processing is typically performed by subjecting a substrate to a plurality of sequential processes to create devices, conductors and insulators on the substrate. Each of these processes are generally performed in a processing chamber configured to perform a single step of the production process. In order to efficiently complete the entire sequence of processing steps, a number of processing chambers are typically coupled to a central transfer chamber that houses a robot to facilitate transfer of the substrate between the processing chambers. A semiconductor processing platform having this configuration is generally known as a cluster tool, examples of which are the family of CENTURA® and ENDURA® processing platforms available from Applied Materials, Inc. of Santa Clara, Calif.

In these cluster tools, a central transfer is typically surrounded by one or more processing chambers, at least one load lock chamber and sometimes a dedicated orientation chamber. The processing chambers are generally utilized to perform various processing steps such as etching, physical vapor deposition, chemical vapor deposition, ion implantation, lithography and the like. Processed and unprocessed substrates are housed in a substrate storage cassette disposed in a factory interface coupled to the load lock chamber. The load lock chamber is isolated from the factory interface and the transfer chamber by slit valves. Substrates enter the transfer chamber from the substrate storage cassettes one at a time through the load lock. The substrate is first positioned in the load lock after the substrate is removed from the cassette. The load lock is then sealed and pumped down to match vacuum the operating environment of the substrate transfer chamber. The slit valve between the load lock and transfer chamber is then opened, allowing the substrate transfer robot to access the substrates disposed in the substrate storage cassette. In this fashion, substrates may be transferred into and out of the transfer chamber without having to repeatedly re-establish transfer chamber vacuum levels after each substrate passes through the load lock.

Some processes such as etching and ion implantation require that the substrate have a particular orientation. Typically, substrates include indicia, such as notches or flats on their perimeters in pre-defined locations, that is typically indicative of the orientation of the substrate. Such notches are used as a reference point when orientation of the substrate is required.

Typically, orientation of the substrate occurs in the orientation chamber. The orientation chamber generally includes a platform for rotating the substrate and a sensor for detecting the notch or flat on the substrate's perimeter. For example, the platform disposed in the orientation chamber supports the substrate. A shaft is coupled between the platform and a stepper or servo motor to controllably rotate the substrate. A light source is positioned in the orientation chamber near the edge of the substrate and is directed across the substrate's edge to a sensor. The light source is normally blocked by the substrate's perimeter as the perimeter rotates. As the indicia (e.g., the notch or flat) rotates to a position between the light source and sensor, the light beam passes therethrough and impinges on the sensor. The sensor, in response to the impingement of the light beam, indicates the position of the notch, which accordingly, is indicative of the angular orientation of the substrate. Once the position of the notch is determined, the motor is able to rotate the platform and place the notch in a pre-determined angular position that can be referenced throughout the cluster tool and associated chambers.

Although the use of a dedicated orientation chamber coupled to the cluster tool has traditionally provided a robust process for determining the orientation of a substrate, the demand in the semiconductor industry for reduced cost of tool ownership and increased substrate throughput has made the use of a dedicated orientation chamber undesirable. For example, a dedicated orientation chamber increases the cluster tool hardware and software cost. Moreover, the orientation chamber may utilize a position on the cluster tool that could be allocated to an additional process chamber. Additionally, the use of a dedicated orientation chamber requires a time expenditure that is not directly related to processing. For example, time is spent transferring the substrate into the orientation chamber, clearing the robot arm from the orientation chamber, spinning (i.e., orientating) the substrate and retrieving the substrate. This time is significant as the orientation process takes about six to fourteen seconds to execute.

Therefore, there is a need for an improved method and apparatus for transferring a substrate.

SUMMARY OF THE INVENTION

A substrate storage cassette and a method of orienting a substrate disposed therein are provided. In one embodiment, the substrate storage cassette includes a plurality of flanges pairs disposed between a first lateral sidewall coupled in a spaced-apart relation to a second lateral sidewall. Each of the flange pairs adapted to support a substrate thereon. At least a first alignment feature disposed between the flange pair and adapted to mate with an orientation feature of the substrate when the substrate is in a predefined orientation.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a front view of the substrate alignment cassette of FIG. 1A;

FIG. 11 is a top view of another embodiment of a substrate alignment cassette; and FIGS. 12A–B is a partial sectional view of the substrate alignment cassette of FIG. 11.

To facilitate understanding, identical reference numerals have been used, wherever possible, to designate identical elements that are common to the figures.

DETAILED DESCRIPTION

Figure 1A:
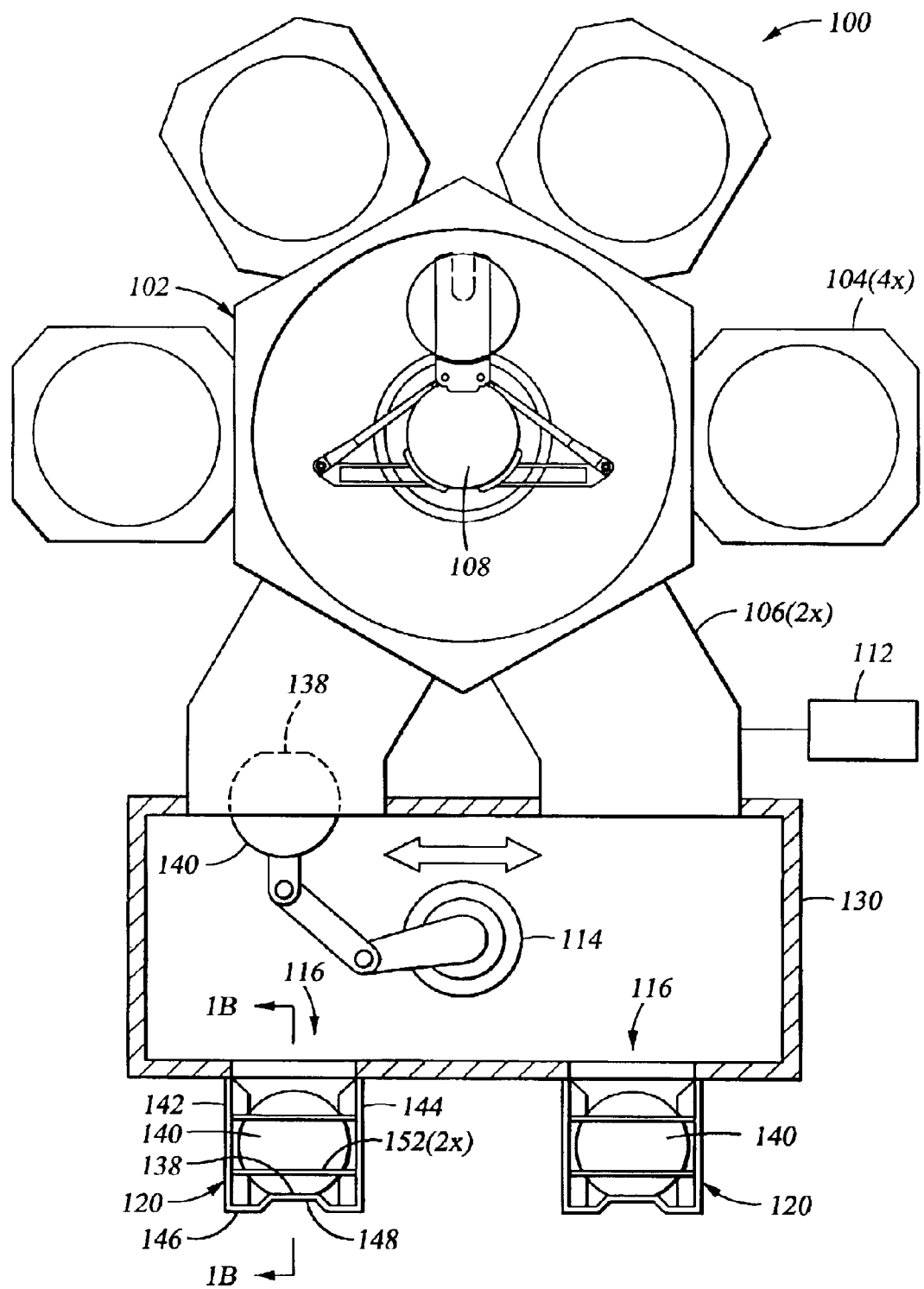
FIG. 1A is a simplified plan, partially in section, of a semiconductor processing system having one embodiment of a substrate alignment cassette.

FIG. 1A is a simplified plan view, partially in section, of a semiconductor processing system 100 having at least one substrate alignment cassette 120 disposed in a factory interface 130 for aligning substrates 140 stored therein in a predefined orientation. Examples of processing systems that may be adapted to benefit from the invention include, but are not limited to, ENDURA® processing platforms, CENTURA® processing platforms, PRODUCER® processing platforms, MIRRA MESA™ chemical mechanical processing platforms, all available from Applied Materials, Inc., located in Santa Clara, Calif. Although the substrate storage cassette is shown disposed within the illustrative processing system 100, the substrate storage cassette may be utilized in other processing systems such as physical vapor deposition systems, etch systems, ion implant systems, rapid thermal anneal systems, among other systems wherein the queuing of substrates having a predefined orientation is desirable, including systems having one processing station at either a vacuum or atmospheric environment.

In one embodiment, the processing system 100 typically includes a transfer chamber 102 coupled to at least one processing chamber 104 and at least one load lock chamber 106. In the embodiment depicted in FIG. 1A, four processing chambers 104 and two load lock chambers 106 are shown. The processing chamber 104 is configured to perform one or more process steps utilized in integrated circuit fabrication. Examples of processes that may be performed in the processing chambers 104 include physical vapor deposition, etching, chemical vapor deposition, ion implant, thermal processing, native oxide removal, and resist application or removal, among others. Such processing chambers are available from a number of sources, including Applied Materials, Inc.

A transfer robot 108 is typically disposed within the transfer chamber 102 to facilitate transfer of substrates between the processing chambers 104 and the load lock chamber 106. One transfer robot that may be adapted to benefit from the invention is a VHP® substrate transfer robot, available from Applied Materials, Inc.

The load lock chamber 106 is coupled to the transfer chamber 102 and facilitates passage of substrates 140 between the substantially ambient atmosphere of the substrate alignment cassette 120 and a vacuum environment of the transfer chamber 102. The load lock chamber 106 is selectively isolated from the factory interface 130 and the transfer chamber 102 by slit valves (not shown). An atmosphere control system 112 is coupled to the load lock chamber 106 to pump down and vent the interior volume of the load lock chamber 106 as the substrate 140 is transferred through the load lock chamber 106 between the factory interface 130 and the transfer chamber 102.

The factory interface 130 typically includes an interface robot 114 and one or more bays 116 (two are shown in FIG. 1). Each of the bays 116 is configured to receive one of the substrate storage cassettes 120. The interface robot 114 may be configured similar to the transfer robot 108, and is adapted to transfer substrates between the load lock chamber 106 and the cassettes 120. Other suitable robots may also be utilized.

Figure 1B:
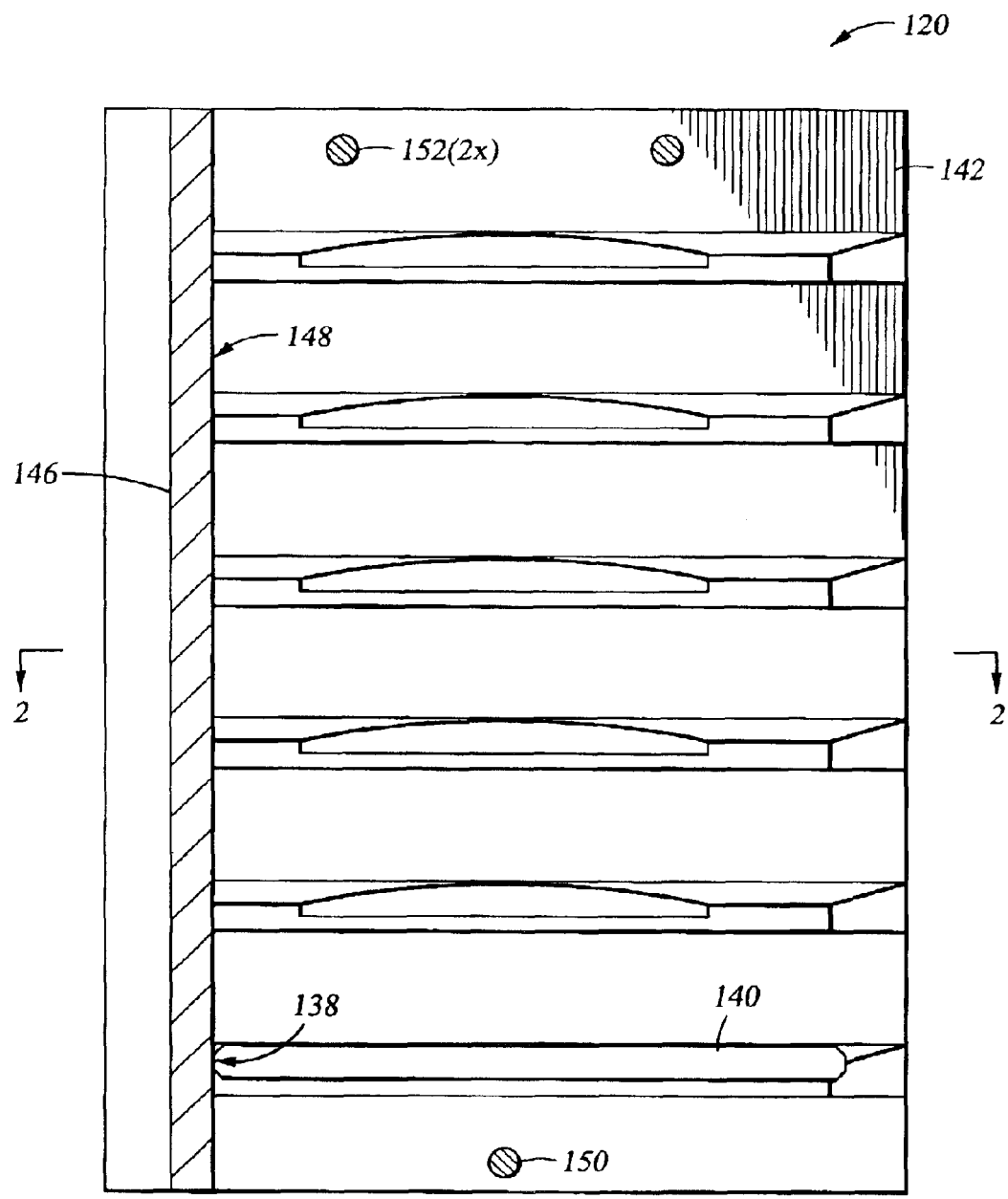
FIG. 1B is a vertical sectional view of the substrate alignment cassette of FIG. 1A taken along section line 1B—1B.

Referring additionally to FIG. 1B, each cassette 120 includes a pair of opposing lateral sidewalls 142, 144 separated by an alignment wall 146. The lateral sidewalls 142, 144 are coupled to at least one bottom spacing element 150 and at least one top spacing element 152 that bound an interior volume configured to accept a plurality of substrates 140 (one of which is shown) to be stacked therebetween in an orientation perpendicular to the sidewalls 142, 144 and parallel to the bottom spacing element 150. The alignment wall 146 is disposed perpendicularly between the lateral sidewalls 142, 144 and includes at least one alignment feature 148 that interfaces with an orientation feature 138 of the substrates 140.

The bottom spacing element 150 is typically perpendicularly coupled to the lateral sidewalls 142, 144 and is typically configured to maintain parallelism between the lateral sidewalls 142, 144. The bottom spacing element 150 may be a rod, bar, plate or web having rigidity suitable for maintain the geometric stability of the cassette 120. In the embodiment depicted in FIG. 1B, the spacing element 152 is pair of rods fastened between the lateral sidewalls 142, 144.

The top spacing element 152 is typically coupled to the lateral sidewalls 142, 144 opposite and parallel to the bottom spacing element 150. The spacing element 152 is typically configured to allow visual inspection of the interaction between the substrate 140 and the alignment feature 148 as the substrates are loaded into the substrate alignment cassette 120. The spacing element 152 may be an optionally transparent plate or a plate substantially similar to the bottom spacing element 150. In the embodiment depicted in FIG. 1B, the spacing element 152 is a pair of rods or bars fastened between the lateral sidewalls 142, 144.

Figure 2:
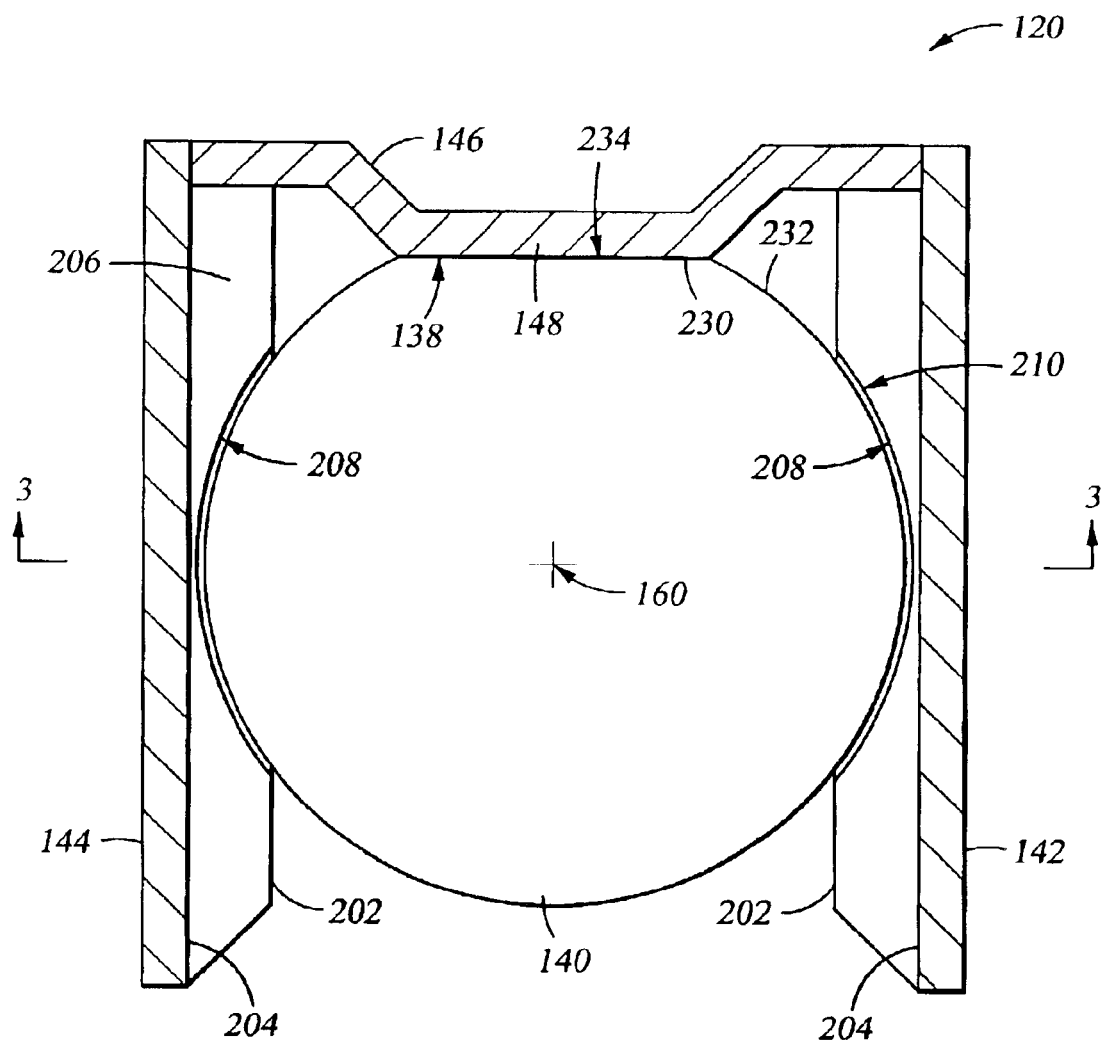
FIG. 2 is a horizontal sectional view of the substrate alignment cassette of FIG. 1B taken along section line 2—2.

Referring to FIG. 1A and a horizontal sectional view of the substrate alignment cassette 120 depicted in FIG. 2, the alignment cassette 120 includes a plurality of flanges 202 extending from facing interior surfaces 204 of each lateral sidewall 142, 144. The flanges 202 are arranged in pairs, each pair comprising one flange extending from sidewall 142 and one flange extending from sidewall 144 and sharing a common elevation referenced from the bottom spacing element 150 (or the bottoms of the sidewalls 142, 144). The profile of each flange 202 may be rectangular, square, tapered or have other geometry suitable for supporting the substrate thereon. In the embodiment depicted in FIG. 2, each flange 202 includes a top surface 206 that faces away from the bottom spacing element 150 of the cassette 120. The top surfaces 206 of each flange pair define a slot 220 with the lateral sidewalls 142, 144 that is adapted to receive a substrate.

An arcuate substrate receiving pocket 208 is formed in the top surface 206 of each flange pair. The substrate receiving pocket 208 are configured to retain the substrates 140 between opposing flanges 202 positioned on the lateral sidewalls 142, 144. The substrate receiving pocket 208 generally retains the substrate 140 in a predefined position within the cassette 120, typically concentric with a center axis 160 of the alignment cassette 120 that typically extends normally from the center of the bottom of the alignment cassette 120.

In one embodiment, the substrate receiving pocket 208 is a depression 210 partially formed in the top surface 206 of the flange 202 coupled to the first lateral wall 142 and partially in the top surface 206 of the flange 202 coupled to the second lateral wall 144. As depicted in FIG. 3, each portion of the depression 210 formed in the flanges 202 includes a retaining wall 304 and a substrate support surface 306. The retaining wall 304 is typically substantially vertical in configuration, but may alternatively be at least partially flared in a manner that receives and retains the substrate. The retaining wall 304 has a radius, defined from a point along the center axis 160, slightly greater than a radius of the substrate 140. Additionally, the radius of the retaining wall 304 is typically less than or equal to half the distance between the lateral sidewalls 142, 144. The depth of the depression 210 is generally sufficient to prevent the substrate 140 from easily sliding out of the substrate receiving pocket 208 as the cassette 120 is moved. The substrate receiving pocket 208 may be alternatively configured in other manners to retain the substrate therein.

The substrate support surface 306 formed in the top surface 206 of each flange 202 supports the substrate within the substrate receiving pocket 208. The substrate support surface 306 is typically substantially parallel to the bottom spacing member 150 and perpendicular to the lateral sidewalls 142, 144 and center axis 160 of the alignment cassette 120.

Figure 4A:
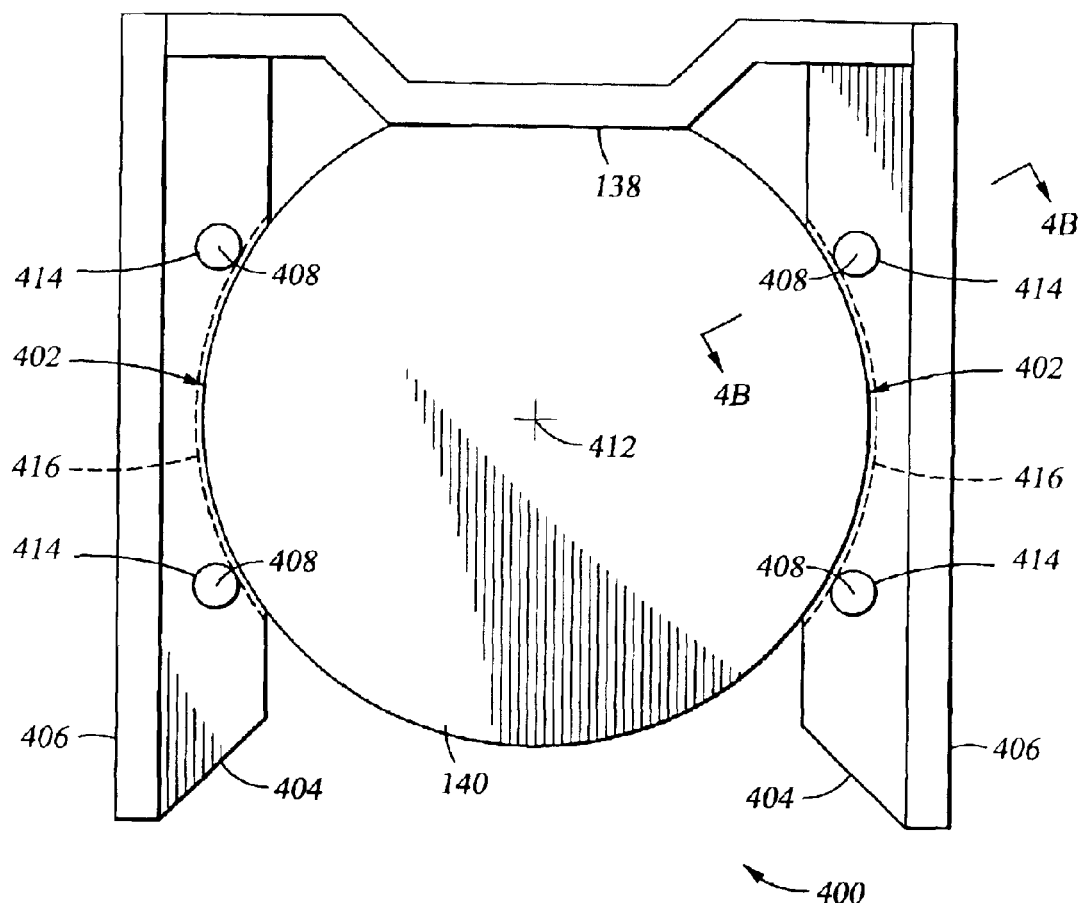
FIG. 4 is a horizontal sectional view of another embodiment of a substrate alignment cassette.
Figure 4B:
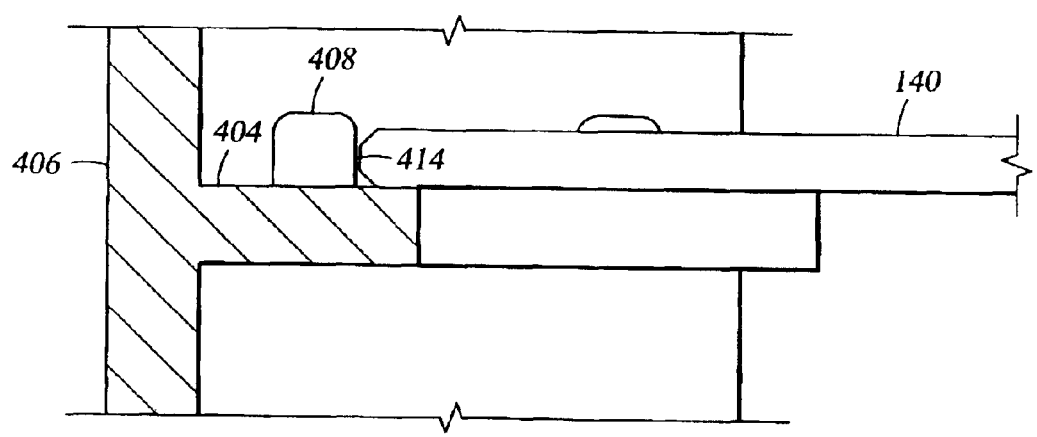

FIGS. 4A–B are sectional views of an alignment cassette 400 having another embodiment of a substrate receiving pocket 402 defined between facing flanges 404 disposed on opposing sidewalls 406. The substrate receiving pocket 402 is defined by a plurality of posts 408 projecting from a top surface 410 of each flange 404. The posts 408 are positioned along a curve having a radius emanating from a center 412 of the cassette 400. Outer diameters 414 of the posts 408 facing the center of the cassette 400 define a retaining wall (shown by dashed lines 416) of the substrate receiving pocket 402 and are disposed at a radius slightly greater than the radius of the substrate 140 thereby retaining the substrate in a predefined position within the cassette 400. Other configurations for defining a substrate retaining pocket on the flanges 404 are contemplated.

Referring back to FIG. 2, the alignment feature 148 of the alignment wall 146 is configured to rotationally orientate the substrate 140 about the center axis 160 of the cassette 120. As various substrates 140 may have different orientation features 138, the alignment feature 148 is contemplated to include any feature on the alignment wall 146 that biases the substrate 140 toward a predefined rotational orientation within the cassette. Typically, the substrate 140 will not drop within the substrate receiving pocket 208 until the alignment feature 148 and the orientation feature 138 of the substrate 140 mate or interface at a predefined rotation of the substrate 140 relative to the center axis 160 of the cassette 100.

In the embodiment depicted in FIG. 2, the alignment feature 148 is configured to interface with an orientation feature 138 configured as a flat 230 formed in a perimeter 232 of the substrate 140. The alignment feature 148 is a planar surface 234 defined perpendicularly and the lateral sidewalls 142, 144 of the cassette 120. A center of the planar surface 234 is positioned at a radius substantially equal to, or slightly greater than the radial distance of the flat 230 from the substrate's center, which when correctly positioned in the cassette 120, is concentric with the center axis 160.

Figure 5A:
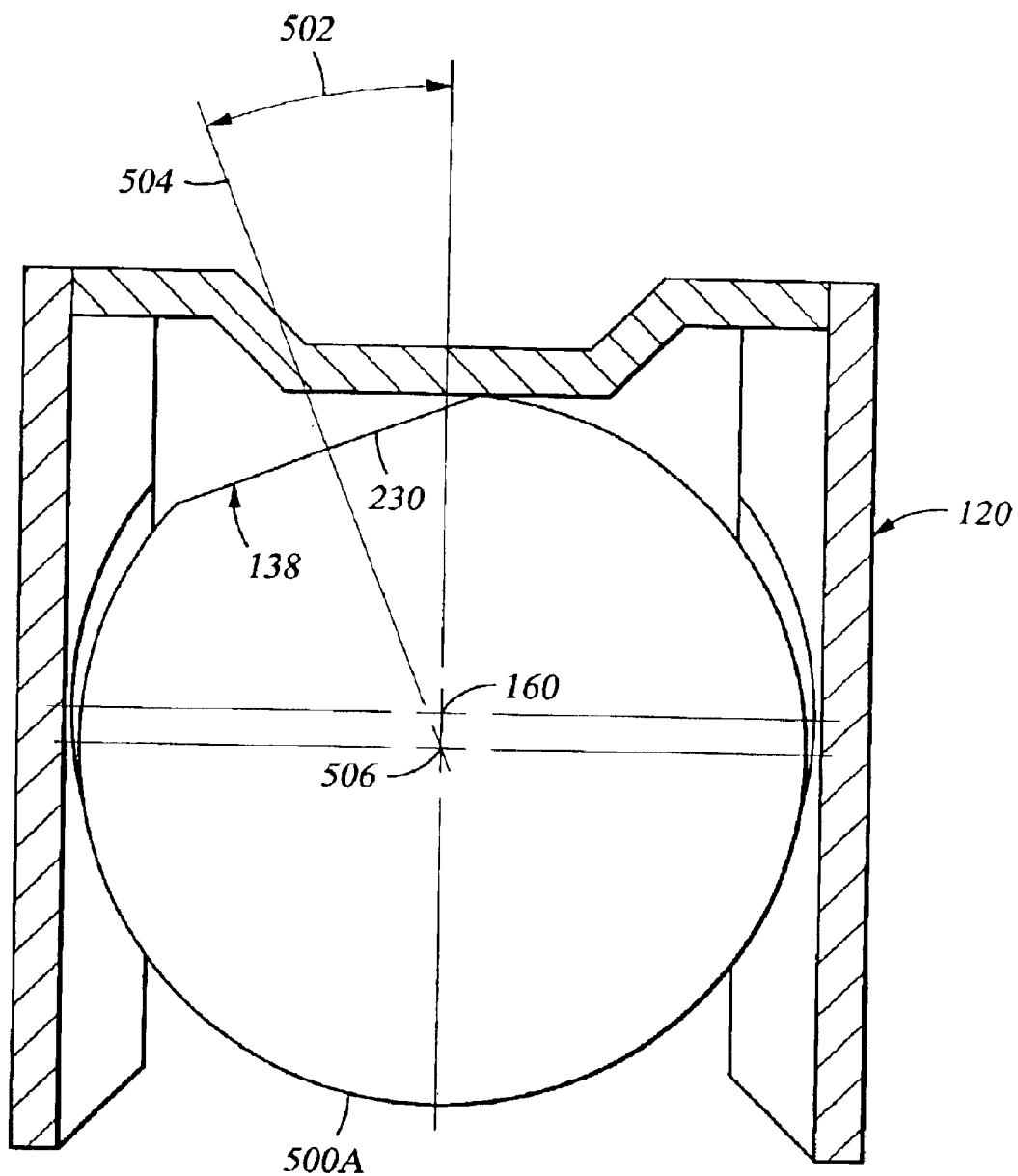
FIGS. 5A–E illustrate moving a substrate into a predetermined orientation within a substrate alignment cassette.

FIGS. 5A–D depict a substrate being biased by the alignment feature 138 into a predetermined orientation within the substrate alignment cassette 120. Referring first to FIG. 5A, a substrate 500A is inserted into one of the slots 220 of the cassette 120. In the illustration of FIG. 5A, the substrate 500A is disposed at an angle 502, referenced from a line 504 extending radially from a center 506 of the substrate 500A and passing perpendicularly through the flat 230, from a predefined (i.e., desired) orientation, illustrated by the substrate 500D (shown in FIG. 5D).

Figure 5B:
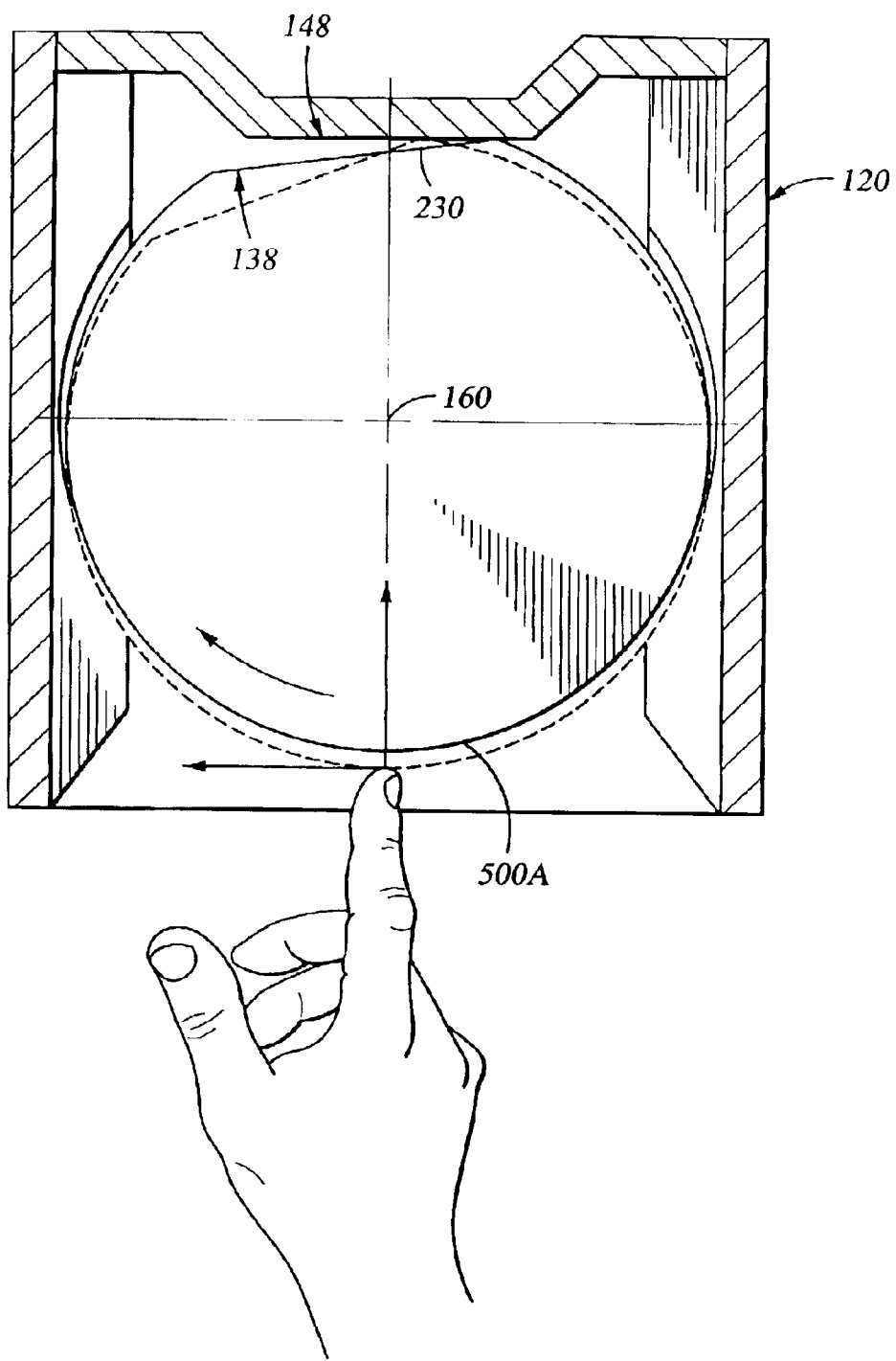
Figure 5C:
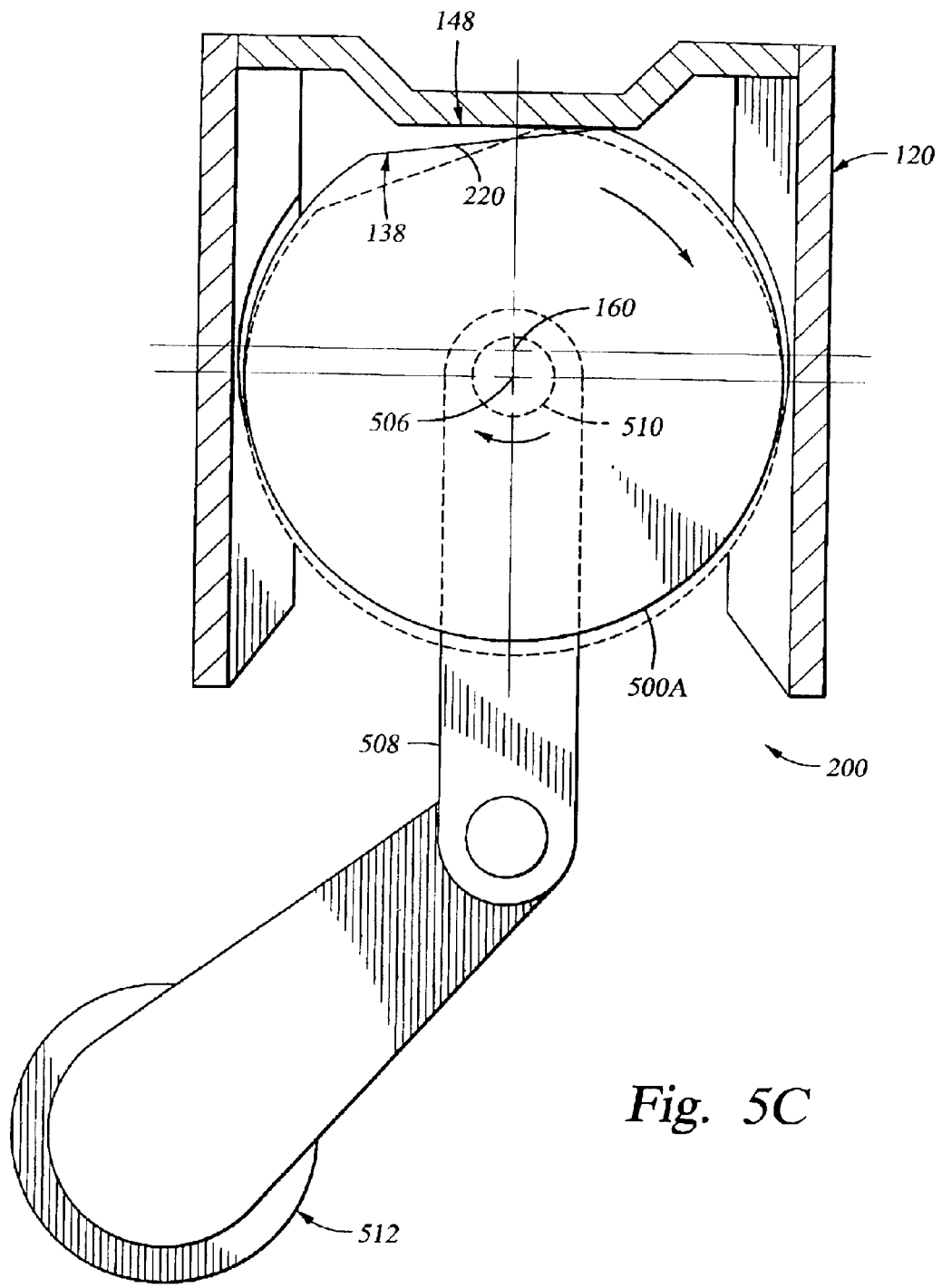

As depicted in FIG. 5B, the substrate 500A is manually rotated by tangentially pushing the perimeter 232 of the substrate 500A. As the substrate rotates, the substrate is moved inward as shown by substrate 500B. The alignment between the flat 230 and the alignment feature 148 may be viewed by looking down through the top of the alignment cassette 120 to determine when the substrate 500B reaches the predetermined orientation, as depicted by substrate 500D seen in FIG. 5D. It is also contemplated that the substrate may alternatively be rotated by vibrating the substrate and/or cassette while the substrate is in contact with the alignment feature 148, or by utilizing a robot 512 (shown in FIG. 5C) having an end effector 508 supporting the substrate 500A on a turntable 510. Examples of such a robot are described in U.S. patent application Ser. No. 09/882,394, filed Jun. 13, 2001, and U.S. Pat. No. 6,002,840, issued Dec. 14, 1999, both of which are hereby incorporated by reference in their entireties.

Figure 5D:
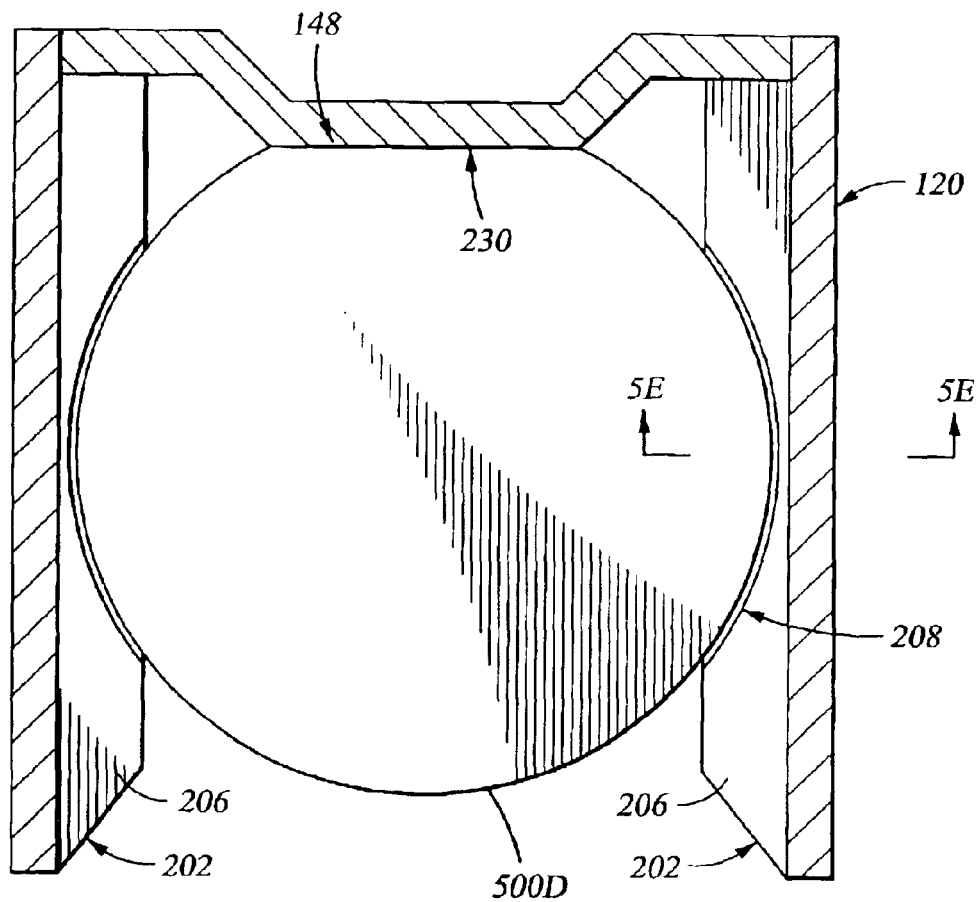
Figure 5E:
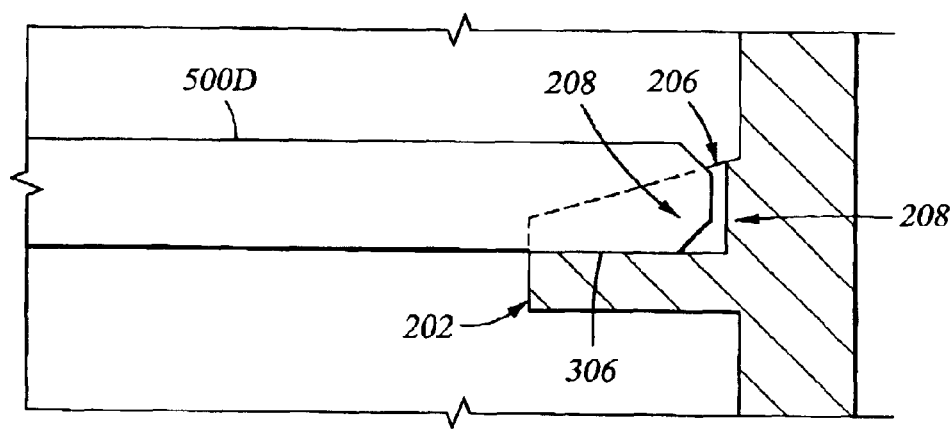

Referring to FIGS. 5D-E, the substrate 500D is shown with the flat 230 disposed against the alignment feature 148 of the cassette 120. In this position, the flat 230 of the substrate 500D is typically within about 2 degrees of parallel to the plane defined by the alignment feature 148. The flat 230 of the substrate 500D is typically also within about 2 degrees of perpendicular to the plane defined by the lateral sidewalls 142, 144. Arrival of the substrate 500D in the predetermined orientation may also be indicated as the substrate 500D slides off the top surface 206 of the flange 202 and onto the substrate support surface 306 of the substrate receiving pocket 208 as the alignment of the flat 230 of the substrate 500D and the alignment feature 148 allows the substrate to move towards the alignment wall 146 and become concentric with the substrate receiving pocket 208.

Figure 6A:
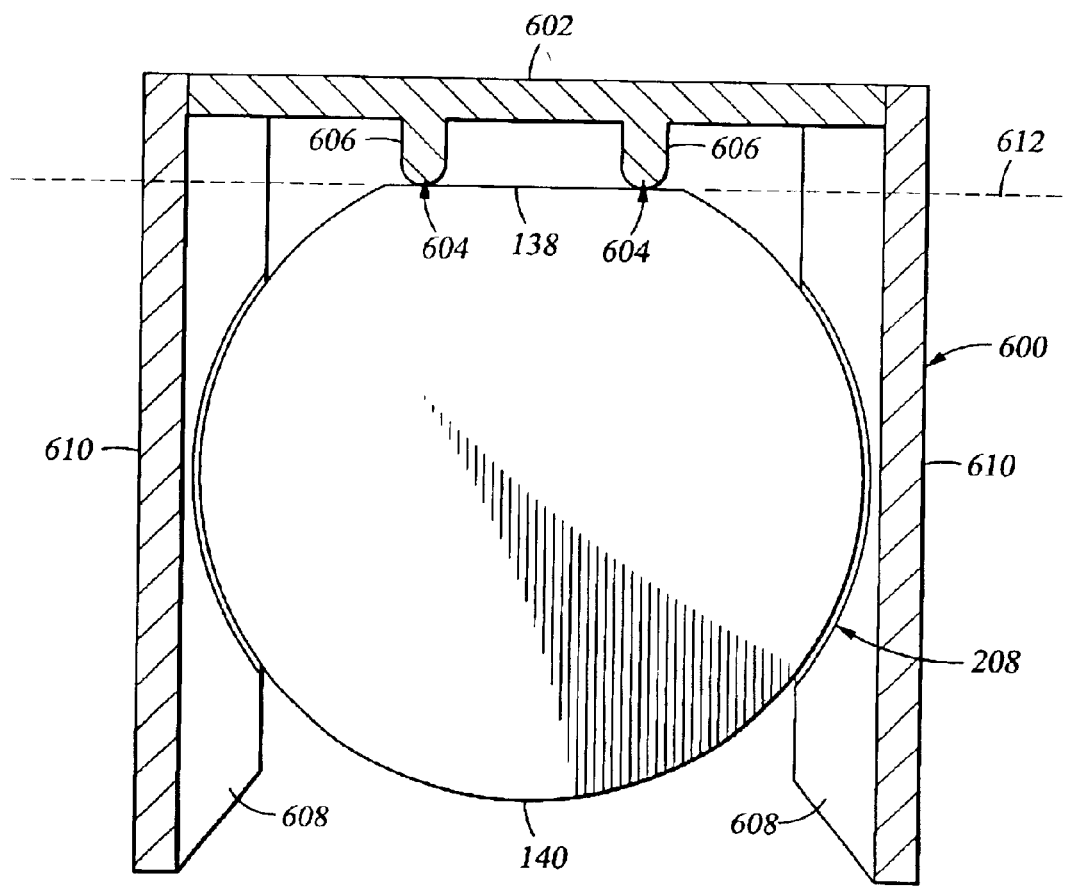
FIGS. 6A–B are a partial sectional views of other embodiments of a substrate alignment cassette.
Figure 6B:
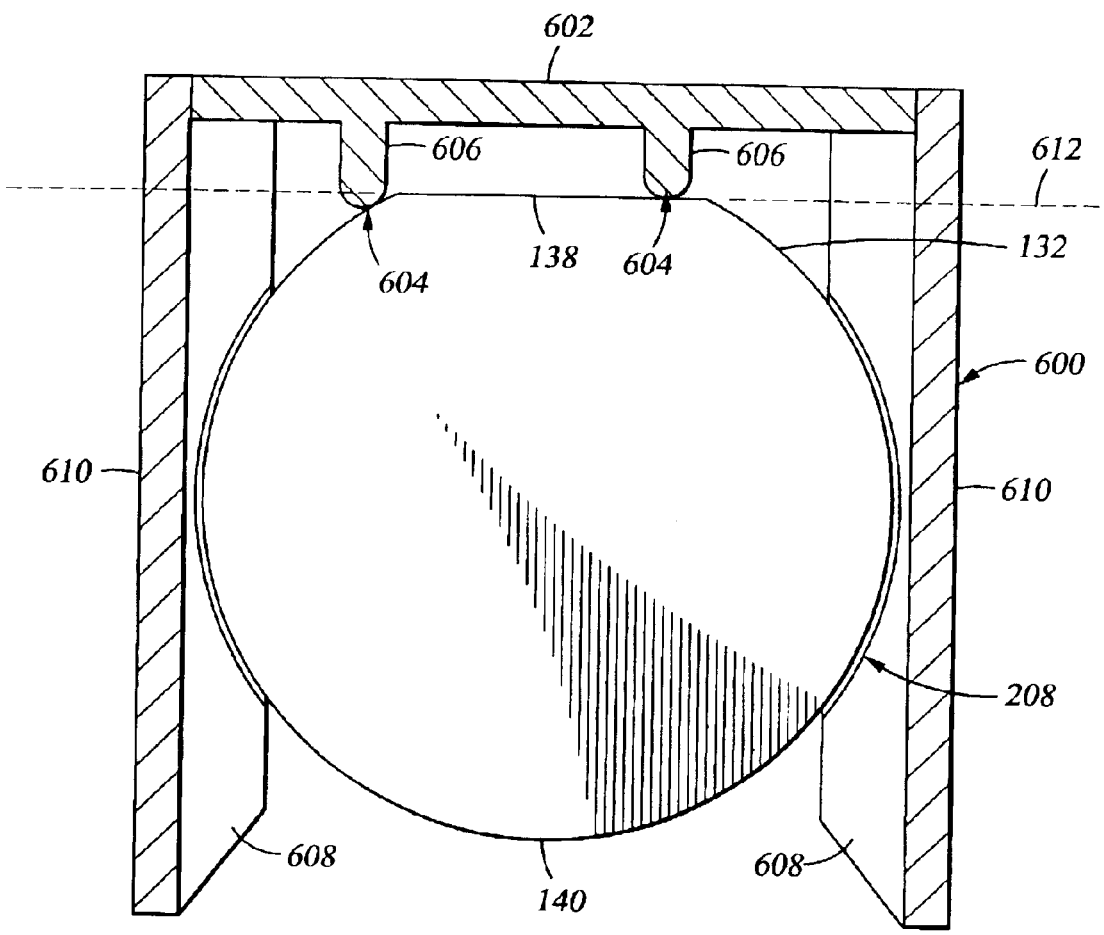

FIGS. 6A–B depict partial sectional views of other embodiments of a substrate alignment cassette 600 illustrating an alignment wall 602 having an alignment feature 604. The alignment feature 604 is comprises of at least two locating elements 606, at least one of which is configured to interface with an orientation feature 138 of a substrate 140. The locating elements 606 may define a plane 612 of the alignment feature 604 similar to the alignment feature 148 described above, or may interface with the substrate 140 in another manner. In the embodiment depicted in FIG. 6A, the locating elements 606 include two ridges extending inward from the alignment wall 602. Both of the locating elements 606 are configured to interface with the orientation feature 138 to align the substrate in a predefined orientation relative to the alignment feature 604. When in the predefined orientation, the substrate 140 will also align with and be received by a substrate receiving pocket 208 formed in flanges 608 extending inward from lateral sidewalls 610 disposed to either side of the alignment wall 602.

In the embodiment depicted in FIG. 6B, a first of the locating elements 606 is configured to interface with the orientation feature 138 while a second of the locating elements 606 is configured to interface with a perimeter 132 of the substrate 140 to align the substrate in a predefined orientation relative to the alignment feature 604. When in the predefined orientation, the substrate 140 is received by a substrate receiving pocket 208.

Figure 7A:
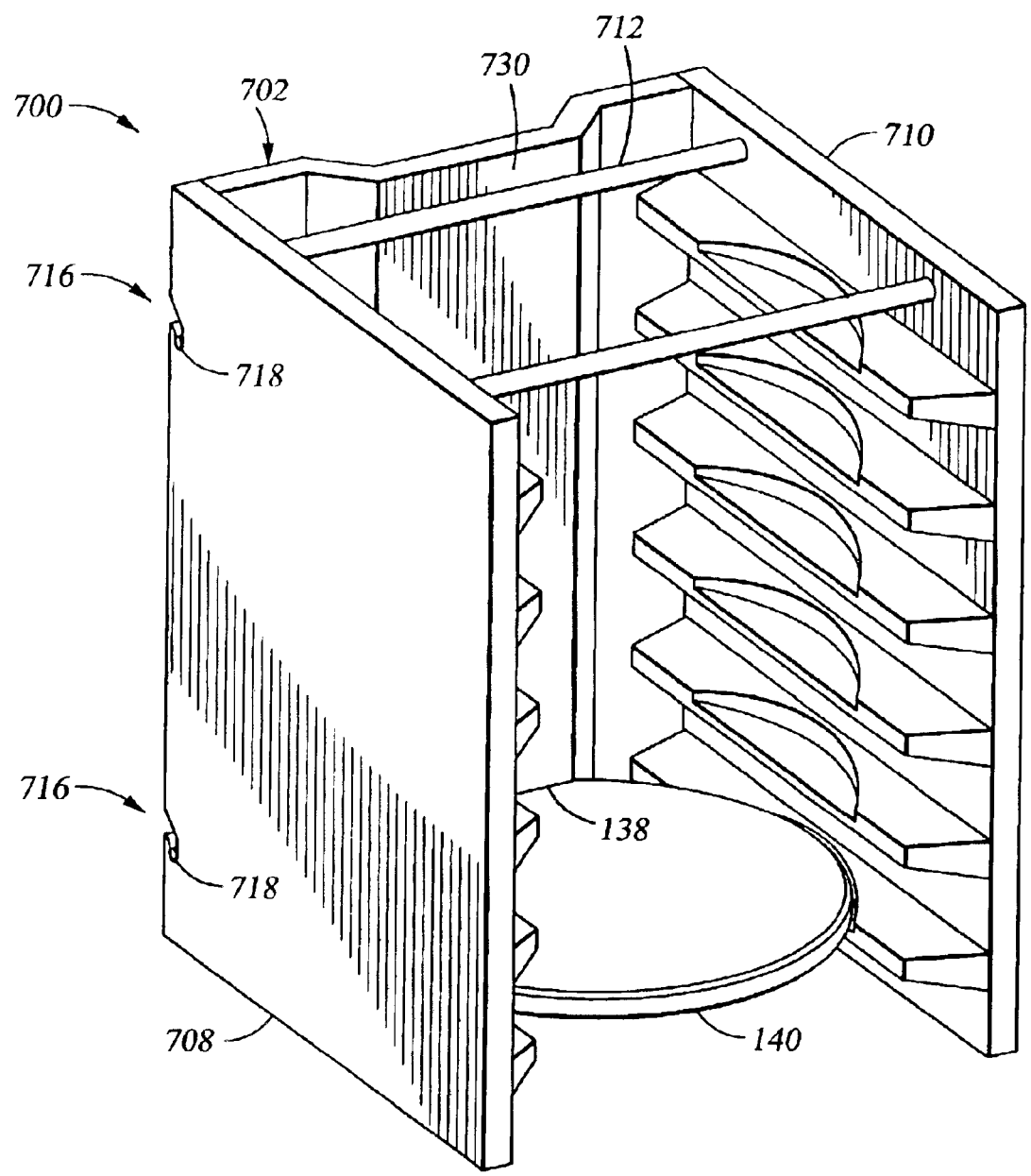
FIGS. 7A–B are perspective views of another embodiment of a substrate alignment cassette.
Figure 7B:
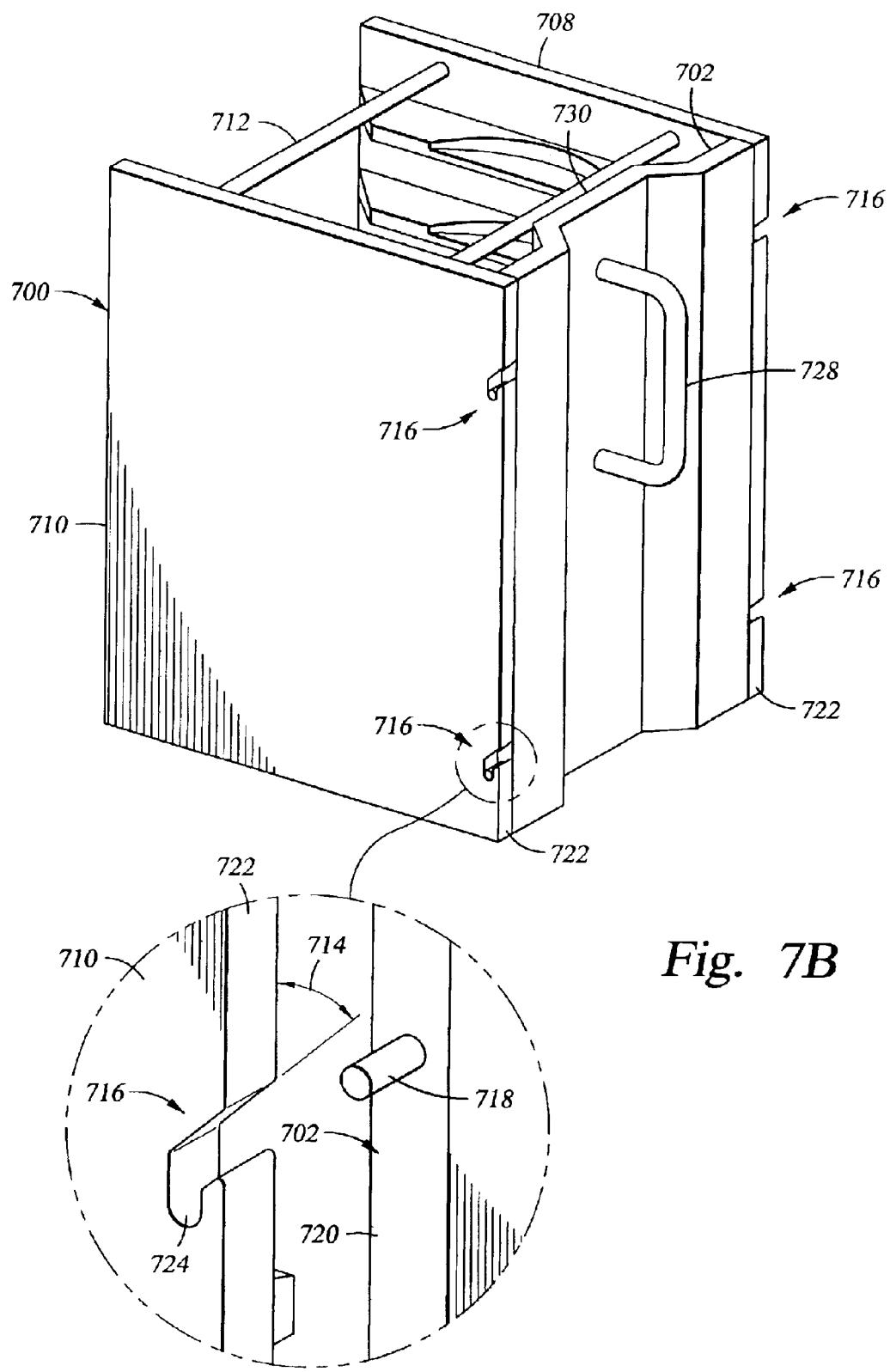
Figure 7C:
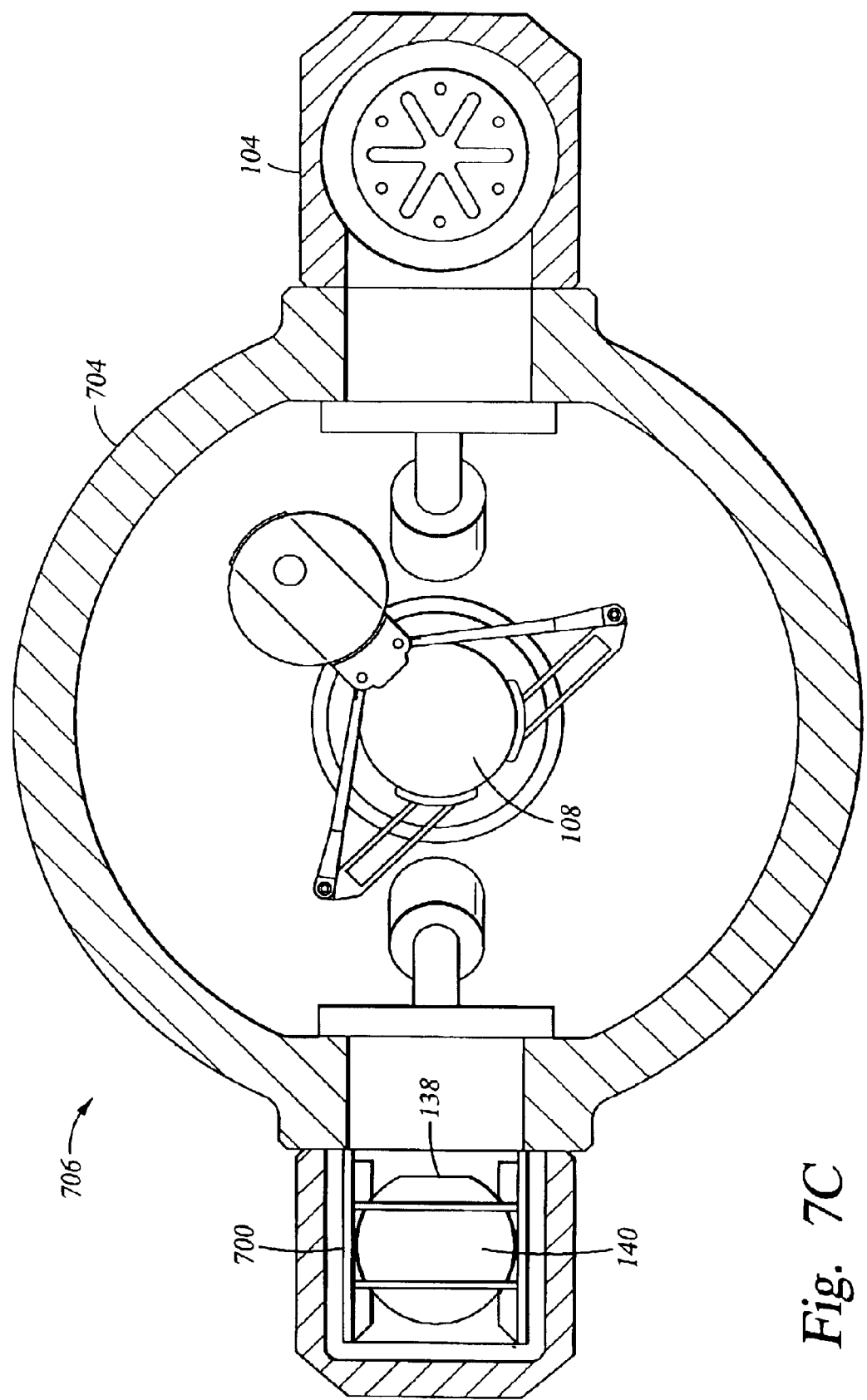
FIG. 7C is a horizontal sectional view of the substrate alignment cassette of FIGS. 7A–B coupled to a processing system.

FIGS. 7A–B are front and back perspective views of another embodiment of an alignment cassette 700 having an alignment feature 730 coupled to an alignment wall 702. The alignment cassette 700 is substantially similar to the alignment cassettes described above, except that the alignment wall 702 of the cassette 700 is removable from the cassette 700. The removable alignment wall 702 allows substrates 140 to be positioned in the cassette 700 with an orientation feature 138 of each substrate 140 facing a transfer chamber 704 of a processing system 706 (as shown in FIG. 7C).

The alignment cassette 700 includes lateral sidewalls 708, 710 maintained in a spaced-apart relation by at least one top spacing element 712 and at least one bottom spacing element (not shown). The lateral sidewalls 708, 710 include a plurality of slots 716 each configured to receive one of a plurality of pins 718 extending from edges 720 of the alignment wall 702 facing the lateral sidewalls 708, 710.

The slots 716 are typically formed in a front vertical edge 722 of the lateral sidewalls 708, 710. The slots 716 include a bottom portion 724 having a full radius substantially equal to that of the pin 718 so that the pin 718 will repeatably position the alignment wall 702 in a predefined position relative to the lateral sidewalls 708, 710. Thus, as the alignment wall 702 is moved and replaced on the cassette 700, the position of the alignment feature 730 in precisely and accurately returned to a predefined position and orientation on the cassette 700.

The slot 710 may also include a clearance portion 726 defined between the bottom portion 724 and the vertical edge 722 of the lateral sidewalls 708, 710. The clearance portion 726 is oriented so that the alignment feature 730 moves away from the substrates 140 retained in the cassette 700 as the alignment wall 702 is removed, thereby minimizing the probability of contact between the wall 702 and substrate 140 and ensuring the substrates remain in their predefined position/orientation within the cassette 700. Typically, the clearance portion 726 is orientated at an angle 714 of about 15 to about 75 degrees relative to the front vertical edge 722 of the lateral sidewalls 708, 710. In one embodiment, the clearance portion 726 is orientated at an angle of about 30 to about 60 degrees.

The embodiment of the cassette 700 depicted in FIGS. 7A–C is generally configured to have the alignment wall 702 removed manually after substrate loading. To that end, the alignment wall 702 may include a handle 728 coupled to the alignment wall 702 to facilitate removal. It is also contemplated that an alignment cassette may include an alignment wall interfacing with lateral sidewalls of the cassette in other configurations and/or be configured to be removed by other methods, including automated alignment wall removal.

Figure 8A:
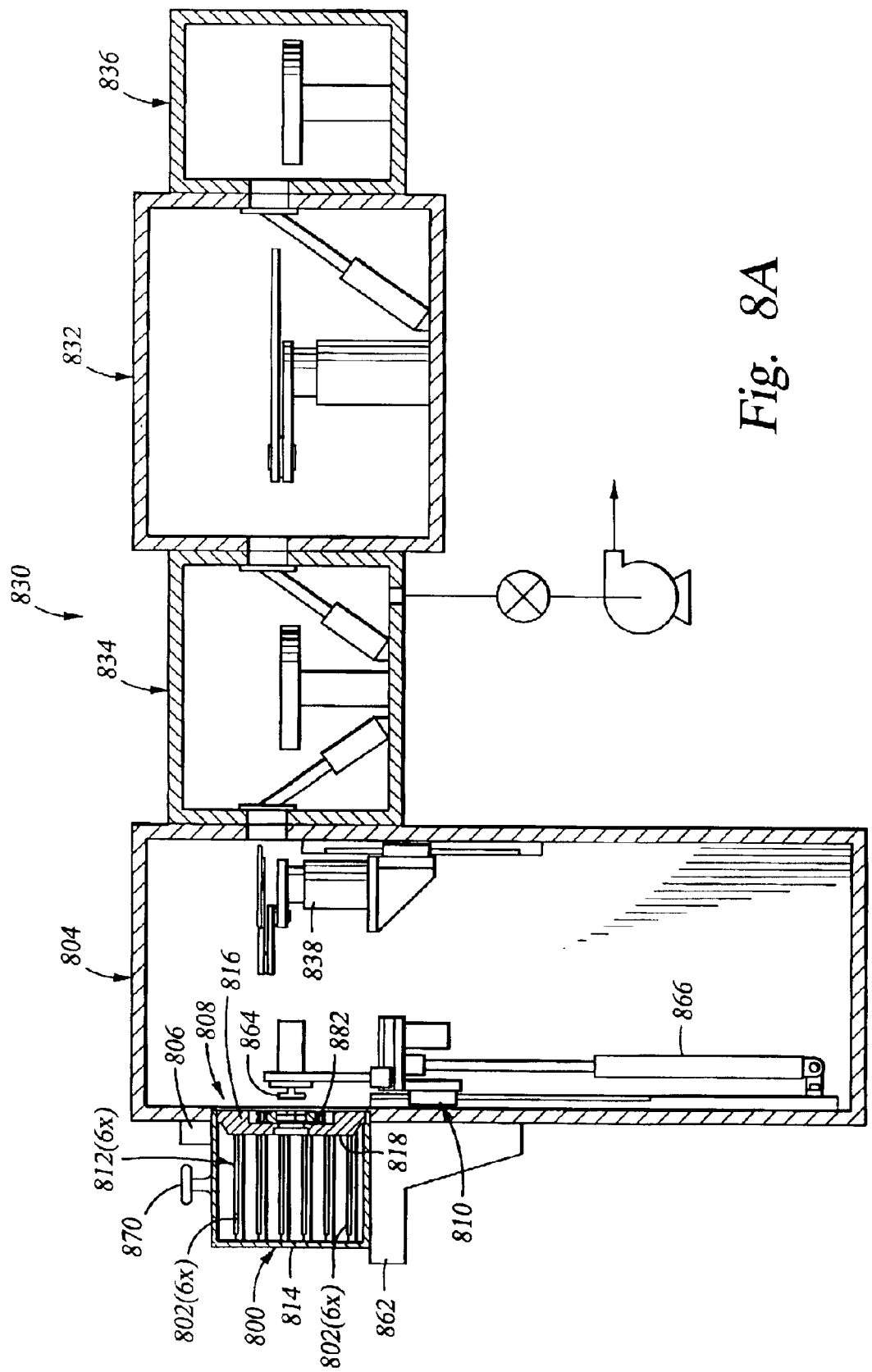
FIGS. 8A and 8C are another embodiment of a substrate alignment cassette coupled to a processing system equipped with a pod door opener.
Figure 8B:
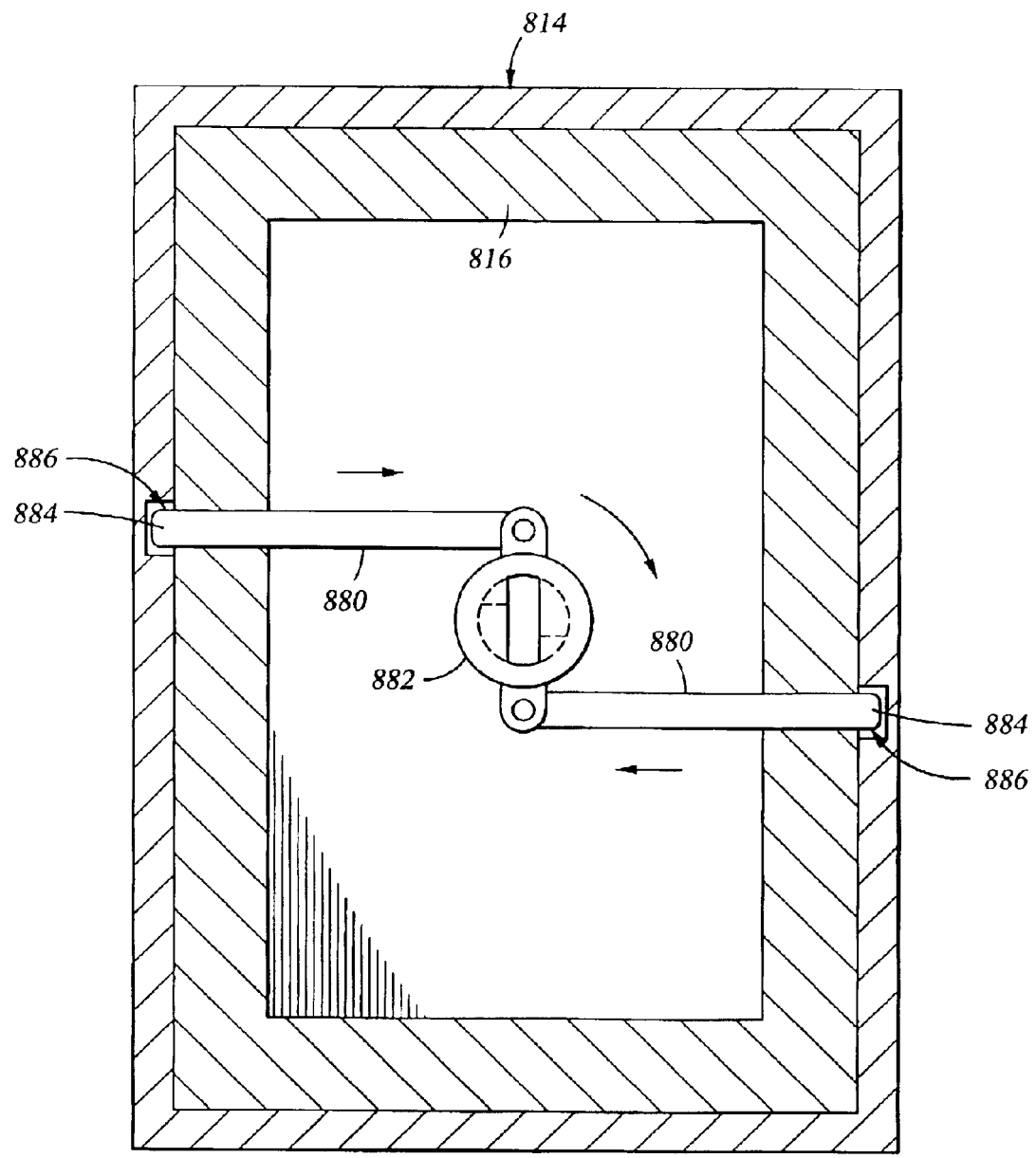
FIG. 8B is a sectional view of the substrate alignment cassette of FIG. 8A.
Figure 8C:
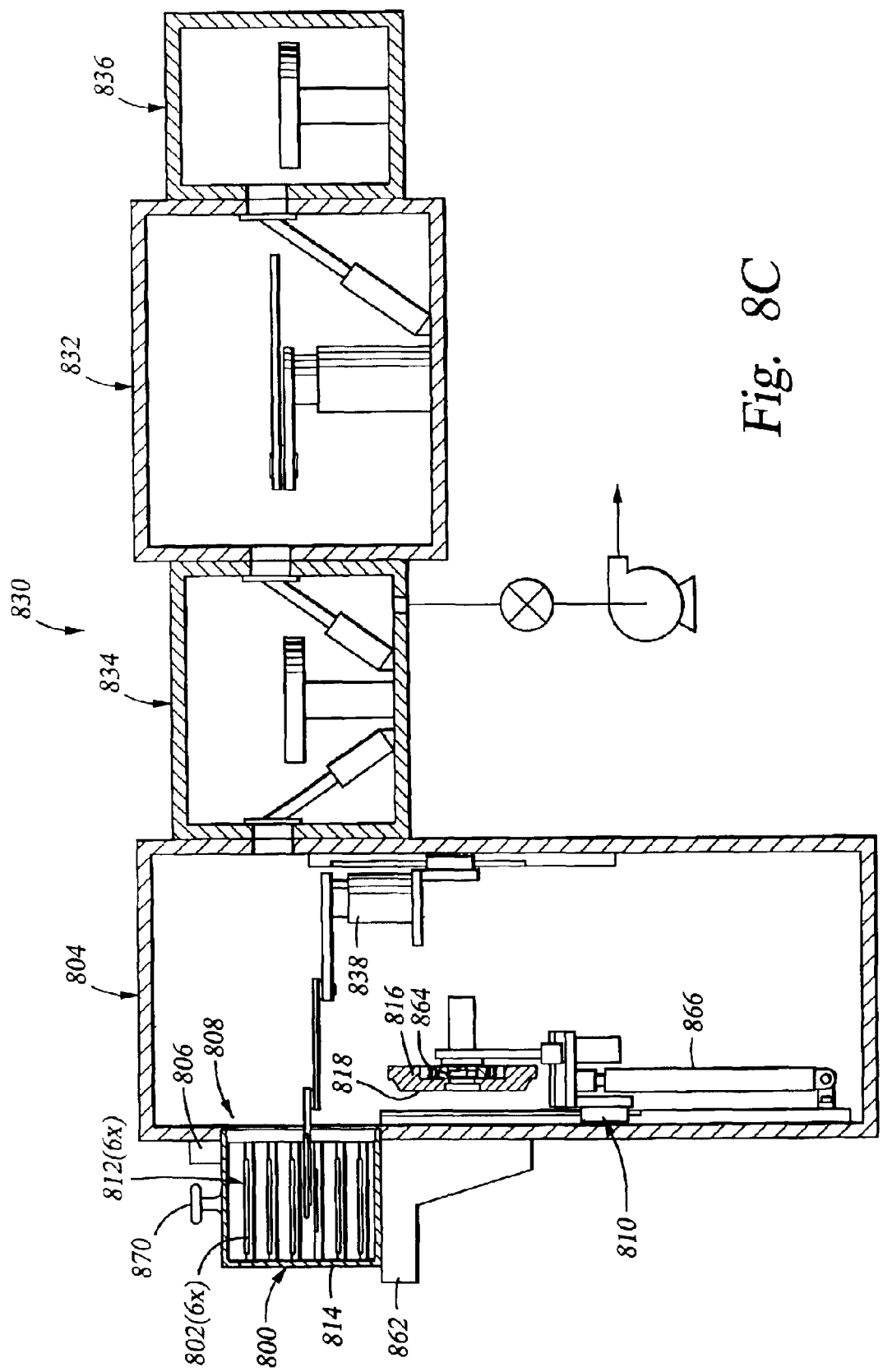

FIGS. 8A–C depict another embodiment of an alignment cassette 800 adapted for automated loading of substrates to a processing system 830. The processing system 830 includes a central transfer chamber 832 having at least one load lock chamber 834 and at least one processing chamber 836 coupled thereto. A factory interface 804 is coupled to the load lock chamber 834 and includes a robot 838 adapted to transfer substrates 802 between the alignment cassette 800 and the load lock chamber 834.

The factory interface 804 includes at least one bay 808 disposed opposite the load lock chamber 834. One substrate storage alignment cassette 800 is coupled to the bay 808. The alignment cassette 800 stores a plurality of substrates 802 that are transferred between the load lock chamber 834 and the alignment cassette 800 by the interface robot 838.

The alignment cassette 800 is typically a front opening unified pod (FOUP) adapted to retain a plurality of substrates therein. One FOUP that may be adapted to benefit from the invention is described in U.S. patent application Ser. No. 10/198,688, filed Jul. 17, 2002, which is hereby incorporated by reference in its entirety. The alignment cassette 800 may include a flange 870 that facilitates handling and transport of the alignment cassette 800 by an automatic carrier apparatus (not shown), such as an auto-guided vehicle (AGV) commonly used in FABS to transfer pods FOUPs between cluster tools and the like.

The alignment cassette 800 includes a plurality of substrate receiving slots 812 formed in a housing 814. Each of the substrate receiving slots 812 is configured to retain one substrate thereon. The alignment cassette 800 has a removable alignment wall or door 816 that seals against the housing 814 to enclose and isolate the substrates within the environment of the cassette. The door 816 includes at least one alignment feature 818 configured to align the substrates laterally and rotationally within the slots 812.

Referring to FIG. 8B, the door 816 of the alignment cassette 800 includes a plurality of latches 880 coupled to a cylinder 882. The cylinder 882 may be rotated to extend a distal end 884 of each latch 880 beyond the door 816 to engage with a slot 886 formed in the housing 814, thereby retaining the door 816 to the housing 814.

Referring back to FIGS. 8A and 8C, a pod door opener (PDO) 810 is coupled to each bay 808 and supports the alignment cassette 800 while coupled to the factory interface 804. The PDO 810 is configured to sealingly mate with the alignment cassette 800. In one embodiment, the PDO 810 is configured to conform to specifications set forth in SEMI Specification No. E57-1296, which is hereby incorporated by reference in its entirety. One PDO that may be adapted to benefit from the invention is described in U.S. Pat. No. 6,082,951, issued Jul. 4, 2000 to Nering et al., which is hereby incorporated by reference in its entirety. The PDO 810 may alternatively be configured to other standards or specifications.

The PDO 810 generally includes a vertical docking station 806 coupled to a horizontal flange 862. The docking station 806 is coupled to the bay 808 and includes a key 864 that is inserted into the cylinder 882 of the door 816 of the alignment cassette 800. The key 864 may be actuated to rotate the cylinder 882, thereby retracting the latches 880 from the slots 886 and into the door 816. Once the latches 882 are clear from the housing 814, the key 864 and door 816 coupled thereto are moved into the factory interface 804 and clear of the bay 808 to allow substrate exchange between the system 830 and the alignment cassette 800 by the robot 838.

Figure 9:
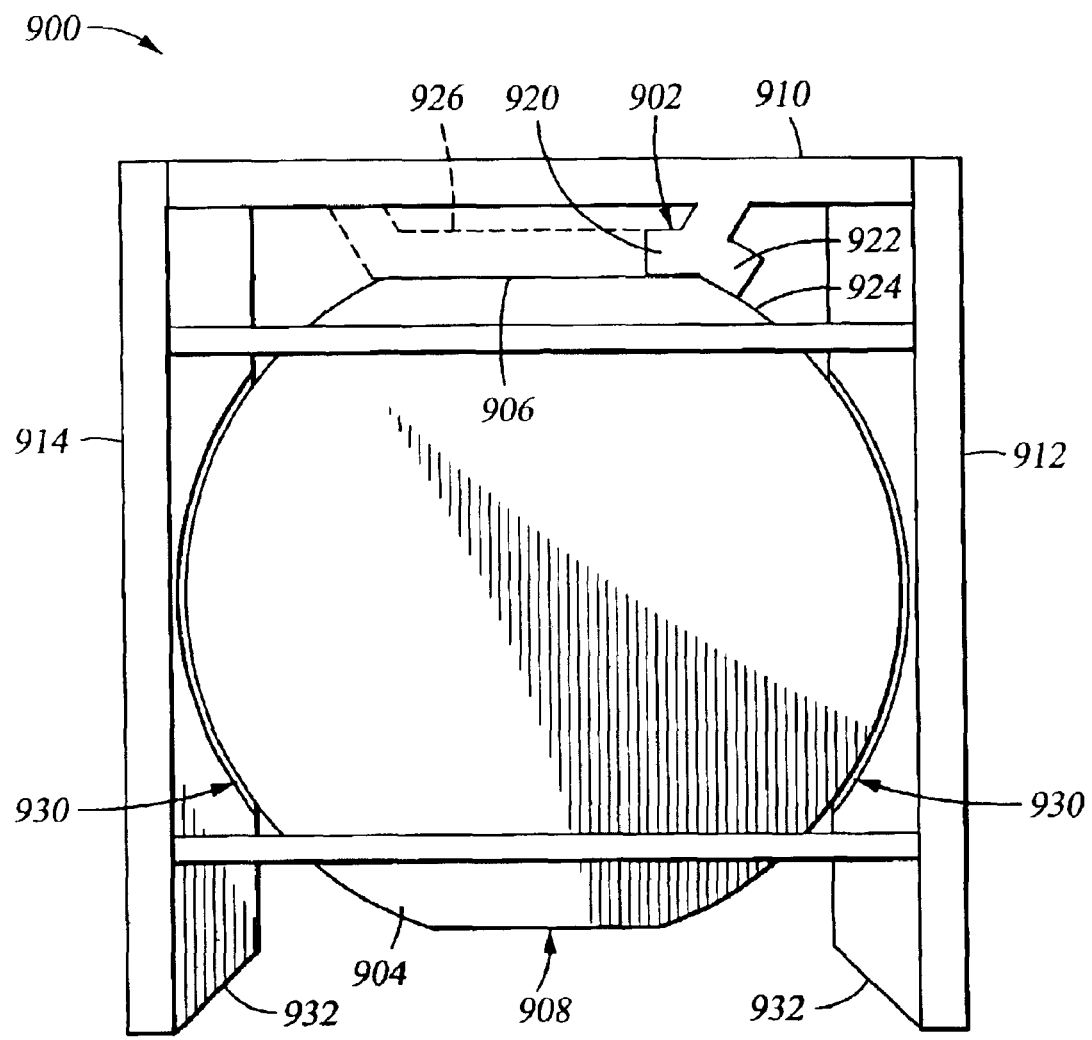
FIG. 9 is a top view of another embodiment of a substrate alignment cassette.

FIG. 9 is a sectional view of another embodiment of an alignment cassette 900. The alignment cassette 900 is substantially similar to the alignment cassettes described. The alignment cassette 900 includes an alignment feature 902 that is adapted to orient substrates 904 having major and minor flats 906, 908.

In one embodiment, the alignment feature 902 is at least partially coupled to a first wall 910 of the cassette 900. The alignment feature 902 may be alternatively coupled to one or more of the other walls 912, 914. The first wall 910 may be integral with the other walls 912, 914 or removable from the cassette 900. The alignment feature 902 includes a first portion 920 adapted to interface with one of the flats 906, 908 and a second portion 922 adapted to interface with a curved portion 924 of the substrate 904 between the flats 906, 908.

In the embodiment depicted in FIG. 9, the first portion 920 of the alignment feature 902 is adapted to interface with the major flat 906. The first portion 920 may extend completely (as shown by phantom line 926) or partially across the major flat 906. The second portion 922 of the alignment feature 902 is configured to mate with the curved portion 924 of the substrate 904 when the major flat 906 is disposed against the first portion 920 of the alignment feature 902 at a predetermined orientation. When the first and second portions 920, 922 of the alignment feature 902 is aligned with the major flat 906 and curved portion 924 of the substrate 904, the substrate 904 will become centered (or positioned at a predetermined location) within the cassette 900. Typically, within this position, the substrate 904 will fall into a substrate receiving pocket 930 formed in flanges 932 of the cassette 900. If the minor flat 908 were to be disposed against the first portion 920 of the alignment feature 902, the substrate 904 would be positioned too far into the cassette 900 for the substrate 904 to align with and fall into the substrate receiving pocket 930, thereby indicating improper positioning and orientation of the substrate 904 within the cassette 900.

Figure 10:
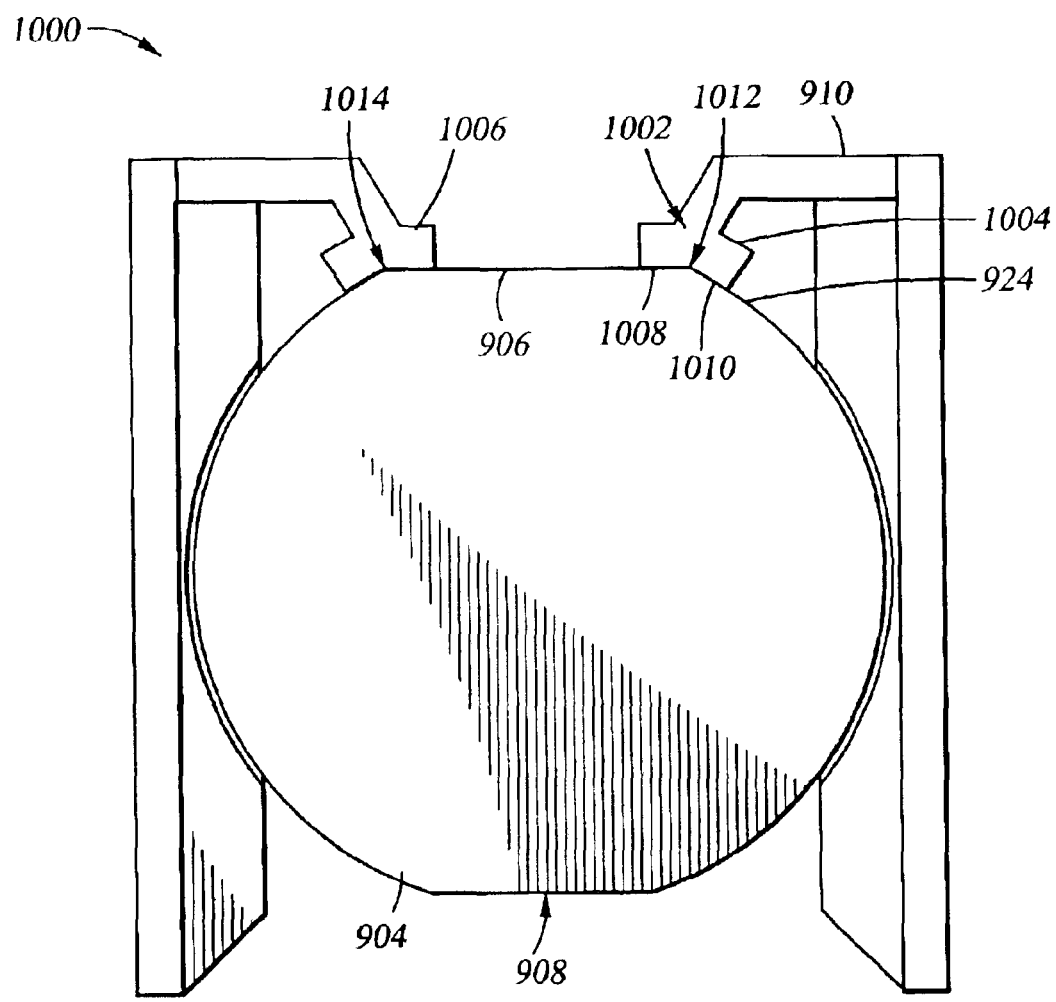
FIG. 10 is a top view of another embodiment of a substrate alignment cassette.

FIG. 10 depicts another embodiment of an alignment cassette 1000 having at least one alignment feature 1002 adapted to align a substrate 904 having major and minor flats 906, 908. The alignment feature 1002 includes a first portion 1004 and a second portion 1006. The first portion 1004 includes a flat surface 1008 that transitions to a curved surface 1010. The second portion 1006 is similarly configured mirrored about the center of the alignment cassette 1000. The first and second portions 1004, 1006 may optionally share the same flat surface 1008. In one embodiment, the first and second portions 1004, 1006 of the alignment feature 1002 are adapted to mate with the transitions 1012, 1014 of the major flat 906 to the curved portion 924 of the substrate 1004, thereby aligning the substrate 904 within the cassette 1010. Alternatively, the first and second portions 1004, 1006 of the alignment feature 1002 may be adapted to mate with the transitions of the minor flat 908 to the curved portion 924 of the substrate 904.

FIG. 11 is another embodiment of an alignment cassette 1100 having an alignment feature 1102. The alignment cassette 1100 is substantially similar to the alignment cassettes described. The alignment feature 1102 that is adapted to orient substrates 1104 having an orientation feature formed in a perimeter 1106 of the substrate, for example, a notch 1008.

In one embodiment, the alignment feature 1102 is at least partially coupled to a first wall 1110 of the cassette 1100. The first wall 1110 may be integral with the other walls 1114, 1116 or removable from the cassette 1100. The alignment feature 1102 projects from the first wall 1110 to mate with the notch 1108 when the substrate 1104 is rotated to a predetermined position. When the substrate 1104 is in the predetermined position, the substrate 1104 will mate with a substrate receiving pocket 1122 formed in flanges 1120 of the alignment cassette 1100. The alignment feature 1102 typically is a vertical projection, such as a flange, rib or tab, having first end 1132 coupled to the first wall 1110 and a second end 1130 that mates with the orientation feature (notch 1108) of the substrate 1104.

FIG. 12A is a sectional view of one embodiment of the alignment feature 1102. In the embodiment depicted in FIG. 12A, the alignment feature 1102 is a continuous vertical projection, such as a rib 1202, having its second end 1130 mating with the notch 1108 of the substrate 1104.

FIG. 12B is a sectional view of another embodiment of the alignment feature 1102. In the embodiment depicted in FIG. 12A, the alignment feature 1102 comprises a plurality of linearly aligned tabs 1214 projecting from the first wall 1110 and having its second end 1130 mating with the notch 1108 of the substrate 1104. It is contemplated that the alignment feature 1102 may have other configurations that match with a notch 1108 (or other orientation feature) of the substrate 1104 in a manner that rotationally and laterally locates the substrate 1104 in the alignment cassette 1100.

Thus, an alignment cassette has been provided that facilitates alignment of substrates within the cassette. Advantageously, the alignment cassette removes the need for dedicated orientation platforms, chambers, robots and the like from processing system, thereby reducing system costs. The alignment cassette may be adapted for use in simple, one processing chamber systems or in more complex systems that utilized FOUPs and automated PODs.

While the foregoing is directed to the preferred embodiment of the present invention, other and further embodiments of the invention may be devised without departing from the basic scope thereof, and the scope thereof is determined by the claims that follow.

What is claimed is:

1. A substrate storage cassette adapted for orienting a substrate having an orientation feature, comprising:
   a first lateral sidewall;
   a second lateral sidewall coupled in a spaced-apart relation to the first lateral sidewall;
   a plurality of flange pairs disposed between the first lateral sidewall and the second lateral sidewall, each of the plurality of flange pairs having a top surface adapted to support a substrate thereon; and
   at least a first alignment feature disposed between the flange pairs, the first alignment feature being adapted to mate with the orientation feature of the substrate when the substrate is rotated to a predefined orientation, wherein the first alignment feature further comprises:
   a flat surface disposed between the lateral sidewalls; and
   a concave surface coupled to the flat and having a radius originating from a center axis of the cassette.

2. The substrate storage cassette of claim 1, wherein the first flange pair further comprises a substrate receiving pocket disposed on the top surface.

3. The substrate storage cassette of claim 2, wherein the substrate receiving pocket is at least defined by a recess slightly greater than the circumference of the substrate, having a first portion formed in a first flange coupled to the first lateral sidewall and a second portion formed in a second flange coupled to the second lateral sidewall opposite the first portion.

4. The substrate storage cassette of claim 2, wherein the substrate receiving pocket further comprises at least two points defined on an arc and having a radius slightly greater than a radius of the substrate, the radius of the arc defined from a center axis of the substrate receiving pocket.

5. The substrate storage cassette of claim 4, wherein the arc is a depression formed in the top surface of the flanges.

6. The substrate storage cassette of claim 4, wherein a first post and a second post extend from the top surface of a first flange of one of the flange pair, the two points defining the arc lying on an outer diameter of the posts.

7. The substrate storage cassette of claim 1, wherein the first alignment feature further comprises a planar surface defined perpendicular to the lateral sides, the planar surface disposed at a distance from a central axis of the cassette less than half a distance between lateral sidewalls.

8. The substrate storage cassette of claim 7, wherein the first alignment feature further comprises a pair of projecting elements disposed between the lateral sidewalls.

9. The substrate storage cassette of claim 7, wherein the projecting elements are at least one of continuous or vertically aligned ribs, tabs or flanges.

10. The substrate storage cassette of claim 1, wherein the first alignment feature further comprises a projecting element having an inner end disposed at a distance from a center axis of the cassette that is less than half a distance between a center wall.

11. A substrate storage cassette adapted for orienting a substrate having an orientation feature, comprising:
a first lateral sidewall;
a second lateral sidewall coupled in a spaced-apart relation to the first lateral sidewall;
a plurality of flange pairs disposed between the first lateral sidewall and the second lateral sidewall, each of the plurality of flange pairs having a top surface adapted to support a substrate thereon; and
at least a first alignment feature disposed between the flange pairs, the first alignment feature being adapted to mate with the orientation feature of the substrate when the substrate is rotated to a predefined orientation; and
an alignment wall coupled between the lateral walls, the alignment feature coupled to a side of the alignment wall facing between the lateral walls, wherein the alignment wall is removable from the lateral walls.

12. The substrate storage cassette of claim 11, wherein the alignment wall further comprises a plurality of pins extending therefrom, each of the pins selectively disposed in a respective slot formed in the lateral walls.

13. The substrate storage cassette of claim 11, wherein the alignment wall is adapted to interface with and be removed by a pod door opener.

14. A substrate storage cassette adapted for orienting a substrate having an orientation feature, comprising:
a pair of opposed lateral sidewalls;
a plurality of substrate receiving pockets disposed between and substantially perpendicular to the lateral sidewalls; each substrate receiving pockets having an annular retaining surface defined at a radius about equal to or greater than a radius of the substrate; and
at least a first alignment feature adapted to mate with the orientation feature of the substrate when the substrate is rotated to a predefined orientation and disposed between the lateral sidewalls, the first alignment feature disposed at a distance from a center of the substrate receiving pocket less than the radius of the annular retaining surface, wherein the first alignment feature further comprises:
a flat surface disposed between the lateral sidewalls; and
a concave surface having a radius originating from the center axis of the substrate receiving pocket and coupled to the flat.

15. The substrate storage cassette of claim 14, wherein substrate receiving pocket is formed partially on a first flange extending from a first of the lateral sidewalls and partially formed on a second flange extending from a second of the lateral sidewalls toward the first flange.

16. The substrate storage cassette of claim 14, wherein substrate receiving pocket is formed by a plurality of posts projecting from a pair of flanges extending inwards from the lateral sidewalls.

17. The substrate storage cassette of claim 14, wherein the first alignment feature further comprises a projecting element having an inner end disposed at a distance from the center axis of the substrate receiving pocket that is least than half a distance between the center walls.

18. A substrate storage cassette adapted for orienting a substrate having an orientation feature, comprising:
a pair of opposed lateral sidewalls;
a plurality of substrate receiving pockets disposed between and substantially perpendicular to the lateral sidewalls; each substrate receiving pockets having an annular retaining surface defined at a radius about equal to or greater than a radius of the substrate; and
at least a first alignment feature adapted to mate with the orientation feature of the substrate when the substrate is rotated to a predefined orientation and disposed center of the substrate receiving pocket less than the radius of the annular retaining surface; and
an alignment wall coupled between the lateral walls, the alignment feature coupled to a side of the alignment wall facing between the lateral walls, wherein the alignment wall is removable from the lateral walls.

19. The substrate storage cassette of claim 18, wherein the alignment wall further comprises a plurality of pins extending therefrom, each of the pins selectively disposed in a respective slot formed in the lateral walls.

20. The substrate storage cassette of claim 18, wherein the alignment wall is adapted to be selectively removed by a pod door opener.

21. A substrate storage cassette adapted for orientating substrate having an orientation feature, comprising:
a first lateral sidewall;
a second lateral sidewall coupled to the first lateral sidewall in a spaced-apart relation;
a plurality of flange pairs disposed between the first lateral sidewall and the second lateral sidewall, each of flange pairs having a substrate receive pocket;
an alignment wall removably coupled between the lateral sidewalls; and
at least a first alignment feature coupled to the alignment wall, the first alignment feature disposed at a distance from a center of the substrate receiving pocket less than a radius defined by the substrate receiving pocket, the first alignment feature adapted to mate with the substrate when the substrate is in a predefined orientation.

22. The substrate storage cassette of claim 21, wherein the first alignment feature further comprises a planar surface parallel offset inward from the alignment wall.

23. The substrate storage cassette of claim 21, wherein the alignment wall further comprises a plurality of pins extending from opposite edges of the alignment wall.

24. The substrate storage cassette of claim 23, wherein each of the lateral sidewalls further comprises a plurality of slots formed therein and adapted to receive the pins extending from the alignment wall.

25. The substrate storage cassette of claim 24, wherein each of the slots includes a portion open to a front vertical edge of the lateral sidewalls and oriented at an angle of about 15 to about 75 degrees relative to the front vertical edges.

26. The substrate storage cassette of claim 21, further comprising at least one of a rod or bar extending between the lateral sidewalls.

27. A method for orientating a substrate having an orientation feature in a substrate storage cassette, comprising:

inserting a substrate in a slot of a substrate storage cassette; and rotating the inserted substrate in the slot; and engaging a feature of the substrate with an alignment feature of the cassette when the substrate is in a predefined rotational orientation.

28. The method of claim 27, wherein the step of engaging further comprises:

matching a flat of the substrate against the feature.

29. The method of claim 28, wherein the step of matching further comprises:

mating a perimeter of the substrate adjacent the flat of the substrate with a portion of the alignment feature.

30. The method of claim 27, wherein the step of engaging further comprises:

inserting the alignment feature into a notch of the substrate.

31. The method of claim 27, wherein the step of engaging further comprises:

moving the substrate into a position concentric to a substrate receiving pocket.

32. The method of claim 27, wherein the step of engaging further comprises:

disposing the substrate into a substrate receiving pocket.

33. The method of claim 27, wherein the step of rotating further comprises:

manually turning the substrate.

34. The method of claim 27, wherein step of rotating further comprises:

vibrating the cassette.

35. The method of claim 27, wherein the step of rotating further comprises:

rotating the substrate on a turntable disposed on an end effector supporting the substrate.

36. The method of claim 27, further comprising removing the alignment feature from the cassette.

37. The method of claim 36, wherein the step of removing the alignment feature further comprises:

coupling the alignment wall to a pod door opener.

* * * * *

UNITED STATES PATENT AND TRADEMARK OFFICE
CERTIFICATE OF CORRECTION

PATENT NO. : 6,916,147 B2
DATED : July 12, 2005
INVENTOR(S) : Suh et al.

It is certified that error appears in the above-identified patent and that said Letters Patent is hereby corrected as shown below:

Column 12,
Line 27, after "disposed" insert -- between the lateral sidewalls, the first alignment feature disposed at a distance from a --.

Column 13,
Line 5, after "claim 21" delete ",".
Line 19, after "against the" insert -- alignment --.

Column 14,
Line 12, after "wherein" insert -- the --.

Signed and Sealed this

Twenty-fourth Day of January, 2006

JON W. DUDAS
*Director of the United States Patent and Trademark Office*